(12) United States Patent
Katsuno et al.

(10) Patent No.: US 7,902,565 B2
(45) Date of Patent: Mar. 8, 2011

(54) SEMICONDUCTOR LIGHT EMITTING DEVICE AND METHOD FOR MANUFACTURING SAME

(75) Inventors: Hiroshi Katsuno, Kanagawa-ken (JP); Yasuo Ohba, Kanagawa-ken (JP); Kei Kaneko, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 58 days.

(21) Appl. No.: 12/195,580

(22) Filed: Aug. 21, 2008

(65) Prior Publication Data

US 2009/0057707 A1    Mar. 5, 2009

(30) Foreign Application Priority Data

Aug. 22, 2007    (JP) ................................ 2007-215597

(51) Int. Cl.
*H01L 51/40*    (2006.01)
(52) U.S. Cl. ...................... 257/98; 257/99; 257/E33.062; 257/E33.064; 257/E33.065; 257/E33.067; 257/E33.068; 438/22; 438/46; 438/47
(58) Field of Classification Search .................... 257/98, 257/99, E33.062–E33.065, E33.067, E33.068; 438/22, 46, 47
See application file for complete search history.

(56) References Cited

U.S. PATENT DOCUMENTS

| 5,414,281 | A | * | 5/1995 | Watabe et al. | 257/95 |
| 5,753,941 | A | * | 5/1998 | Shin et al. | 257/98 |
| 6,117,700 | A | * | 9/2000 | Orita et al. | 438/46 |
| 6,462,358 | B1 | * | 10/2002 | Lin et al. | 257/99 |
| 6,577,006 | B1 | * | 6/2003 | Oota et al. | 257/745 |
| 6,583,443 | B1 | * | 6/2003 | Chang et al. | 257/79 |
| 6,693,352 | B1 | * | 2/2004 | Huang et al. | 257/743 |
| 6,900,068 | B2 | * | 5/2005 | Lin et al. | 438/29 |
| 7,067,340 | B1 | * | 6/2006 | Tsai et al. | 438/47 |
| 7,176,479 | B2 | | 2/2007 | Ohba | |
| 7,285,857 | B2 | * | 10/2007 | Kwak et al. | 257/745 |

(Continued)

FOREIGN PATENT DOCUMENTS

JP    2000-031588    1/2000

(Continued)

OTHER PUBLICATIONS

Katsuno, H. et al., "Semiconductor Light Emitting Device and Semiconductor Light Emitting Apparatus", U.S. Appl. No. 12/195,718, filed Aug. 21, 2008.

*Primary Examiner* — Hrayr A Sayadian
(74) *Attorney, Agent, or Firm* — Finnegan, Henderson, Farabow, Garrett & Dunner, L.L.P.

(57) ABSTRACT

A semiconductor light emitting device includes: a laminated body including a first semiconductor layer, a second semiconductor layer, and a light emitting layer provided between the first semiconductor layer and the second semiconductor layer; a first electrode provided on a first major surface of the laminated body and connected to the first semiconductor layer; and a second electrode provided on the first major surface of the laminated body and connected to the second semiconductor layer. The first electrode includes: a first region provided on the first semiconductor layer and including a first metal film; and a second region provided on the first semiconductor layer and including a second metal film, the second metal film having a higher reflectivity for light emitted from the light emitting layer than the first metal film and having a higher contact resistance with respect to the first semiconductor layer than the first metal film.

11 Claims, 14 Drawing Sheets

U.S. PATENT DOCUMENTS

| | | |
|---|---|---|
| 2003/0006409 A1 | 1/2003 | Ohba |
| 2005/0062051 A1* | 3/2005 | Kwak et al. ............... 257/79 |
| 2005/0087755 A1 | 4/2005 | Kim et al. |
| 2005/0156183 A1* | 7/2005 | Tsai et al. ............... 257/96 |
| 2005/0156188 A1* | 7/2005 | Ro et al. ............... 257/103 |
| 2005/0212002 A1* | 9/2005 | Sanga et al. ............... 257/96 |
| 2006/0108598 A1* | 5/2006 | Lai et al. ............... 257/103 |
| 2007/0034883 A1 | 2/2007 | Ohba |
| 2008/0241979 A1* | 10/2008 | Huang et al. ............... 438/29 |
| 2008/0308832 A1* | 12/2008 | Hsieh et al. ............... 257/98 |
| 2010/0051987 A1* | 3/2010 | Katsuno et al. ............... 257/98 |

FOREIGN PATENT DOCUMENTS

JP    2005-116794    4/2005

* cited by examiner

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2007-215597, filed on Aug. 22, 2007; the entire contents of which are incorporated herein by reference.

BACKGROUND OF THE INVENTION

1. Field of the Invention

This invention relates to a semiconductor light emitting device and a method for manufacturing the same in which light produced in the light emitting layer is reflected by the electrode.

2. Background Art

Light produced in a semiconductor light emitting device may be directly extracted outside the device, or may repeat reflection inside the semiconductor light emitting device, illustratively at the interface between the substrate and ambient air, and externally extracted from the device surface, the substrate surface, or the side surface of the device. Part of the light is absorbed by the n-side electrode having low reflection efficiency, which contributes to decreasing the light extraction efficiency. On the other hand, the n-side electrode needs to have a somewhat large area because of constraints on electrode design, such as wire bonding based on ball bonding, bump formation for a flip-chip, and reduction of voltage drop due to the contact resistance of the n-side electrode.

JP-A 2000-031588 (Kokai) discloses a technique for providing a semiconductor device made of nitride semiconductor having few crystal defects by forming a high-quality nitride semiconductor on a substrate. A layer having many crystal defects absorbs light emitted from the light emitting layer and causes loss. However, by using such techniques as disclosed in JP-A 2000-031588 (Kokai), light emitted from the light emitting layer can be prevented from being absorbed inside the device.

SUMMARY OF THE INVENTION

According to an aspect of the invention, there is provided a semiconductor light emitting device including: a laminated body including a first semiconductor layer, a second semiconductor layer, and a light emitting layer provided between the first semiconductor layer and the second semiconductor layer; a first electrode provided on a first major surface of the laminated body and connected to the first semiconductor layer; and a second electrode provided on the first major surface of the laminated body and connected to the second semiconductor layer, the first electrode including: a first region provided on the first semiconductor layer and including a first metal film; and a second region provided on the first semiconductor layer and including a second metal film, the second metal film having a higher reflectivity for light emitted from the light emitting layer than the first metal film and having a higher contact resistance with respect to the first semiconductor layer than the first metal film.

According to another aspect of the invention, there is provided a method for manufacturing a semiconductor light emitting device, including: laminating a first semiconductor layer, a light emitting layer, and a second semiconductor layer on a substrate; removing part of the second semiconductor layer and the light emitting layer to expose the first semiconductor layer; forming a first metal film on a first region of the exposed first semiconductor layer; and forming a second metal film and a third metal film on a second region adjacent to the first region of the exposed first semiconductor layer and on the second semiconductor layer, respectively, the second metal film and the third metal film having a higher reflectivity for light emitted from the light emitting layer than the first metal film and having a higher contact resistance with respect to the first semiconductor layer than the first metal film.

DETAILED DESCRIPTION OF THE INVENTION

Embodiments of the invention will now be described with reference to the drawings.

Figure 1A:
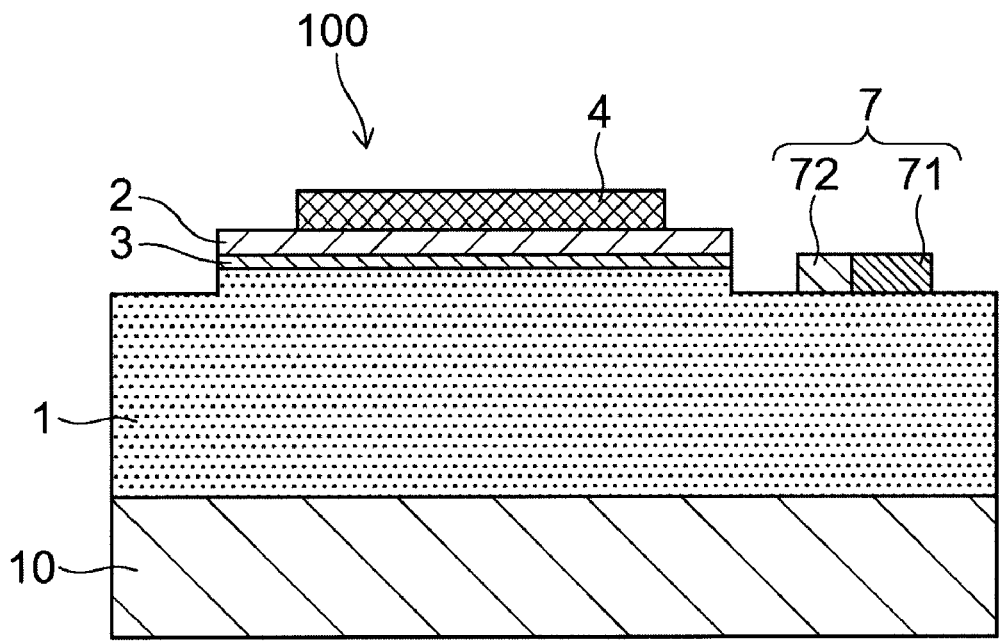
FIGS. 1A and 1B are a schematic cross-sectional view showing the structure of a semiconductor light emitting device according to a first embodiment of the invention, and a schematic plan view thereof.
Figure 1B:
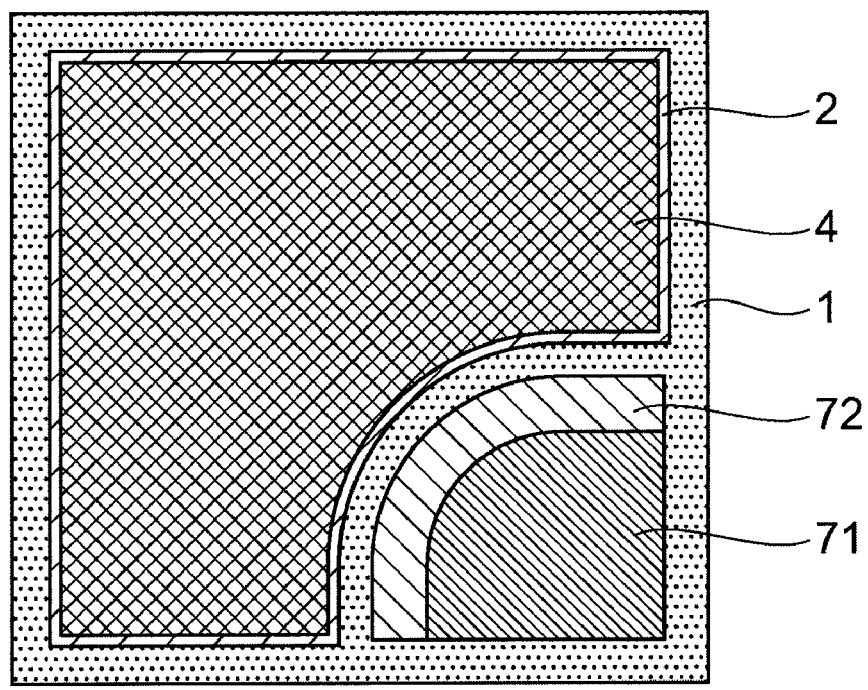

FIG. 1A is a schematic cross-sectional view showing the structure of a semiconductor light emitting device according to a first embodiment of the invention, and FIG. 1B is a schematic plan view thereof.

As shown in FIG. 1A, on a sapphire substrate 10 is formed a laminated body in which an n-type semiconductor layer (first semiconductor layer) 1, a light emitting layer 3, and a p-type semiconductor layer (second semiconductor layer) 2 are laminated in this order. A p-side electrode (second electrode) 4 and an n-side electrode (first electrode) 7 are provided on the same major surface of this laminated body. More specifically, on the p-type semiconductor layer 2 is provided a p-side electrode 4, which includes a first metal film (third metal film) 5 serving as a high-efficiency reflection film and a second metal film 6 made of a metal that does not necessarily need high-efficiency reflection characteristics. The p-type semiconductor layer 2 is partly etched away. On the exposed n-type semiconductor layer 1 is provided an n-side electrode 7, which includes a fourth metal film (second metal film) 71 serving as a high-efficiency reflection film and a fifth metal film (first metal film) 72 serving as an ohmic contact region.

According to this embodiment, the n-side electrode 7 includes a fourth metal film 71 serving as a high-efficiency reflection film. Thus, light emitted from the light emitting layer 3 can be reflected with high efficiency and extracted outside the device. That is, the light extraction efficiency of the semiconductor light emitting device can be increased. On the other hand, the fifth metal film 72 serving as an ohmic contact region serves to reduce the contact resistance with respect to the n-type semiconductor layer 1, thereby decreasing the device resistance and passing a current.

This allows the n-side electrode 7 to have an area required for wire bonding and bump formation while ensuring ohmic contact with the n-type semiconductor layer 1 and increasing the light extraction efficiency by the high reflectivity.

The current flowing between the p-side electrode 4 and the n-side electrode 7 tends to flow through the closest portion therebetween. Thus, in the structure shown in FIG. 1, the fifth metal film 72 is placed nearer to the p-side electrode 4 than the fourth metal film 71 so that the current can be passed more reliably between the fifth metal film 72 and the p-side electrode 4 even if the area of the fifth metal film 72 serving as an ohmic contact region is small.

In the example shown in FIG. 1B, the n-side electrode 7 occupies a corner of a rectangular semiconductor light emitting device, but the configuration of the n-side electrode 7 is not limited thereto.

Next, an example of the laminated structure of semiconductor layers formed on the substrate 10 is described.

The semiconductor light emitting device 100 according to this embodiment is composed of nitride semiconductors formed on the sapphire substrate 10. More specifically, in an example structure, on the substrate 10 with the surface being the sapphire c-plane, metal organic chemical vapor deposition is used to sequentially laminate a first AlN buffer layer with high carbon concentration (with a carbon concentration of $3 \times 10^{18}$-$5 \times 10^{20}$ cm$^{-3}$) to a thickness of 3-20 nm, a second AlN buffer layer with high purity (with a carbon concentration of $1 \times 10^{16}$-$3 \times 10^{18}$ cm$^{-3}$) to 2 μm, a non-doped GaN buffer layer to 3 μm, a Si-doped n-type GaN contact layer (with a Si concentration of $1 \times 10^{18}$-$5 \times 10^{18}$ cm$^{-3}$) to 4 μm, a Si-doped n-type $Al_{0.10}Ga_{0.90}N$ cladding layer (with a Si concentration of $1 \times 10^{18}$ cm$^{-3}$) to 0.02 μm, a light emitting layer of the multiple quantum well structure to 0.075 μm in which a Si-doped n-type $Al_{0.11}Ga_{0.89}N$ barrier layer (with a Si concentration of $1.1$-$1.5 \times 10^{19}$ cm$^{-3}$) and a GaInN light emitting layer (with a wavelength of 380 nm) are alternately laminated three times, a final $Al_{0.11}Ga_{0.89}N$ barrier layer of the multiple quantum well (with a Si concentration of $1.1$-$1.5 \times 10^{19}$ cm$^{-3}$) to 0.01 μm, a Si-doped n-type $Al_{0.11}Ga_{0.89}N$ layer (with a Si concentration of $0.8$-$1.0 \times 10^{19}$ cm$^{-3}$) to 0.01 μm, a non-doped $Al_{0.11}Ga_{0.89}N$ spacer layer to 0.02 μm, a Mg-doped p-type $Al_{0.28}Ga_{0.72}N$ cladding layer (with a Mg concentration of $1 \times 10^{19}$ cm$^{-3}$) to 0.02 μm, a Mg-doped p-type GaN contact layer (with a Mg concentration of $1 \times 10^{19}$ cm$^{-3}$) to 0.1 μm, and a highly Mg-doped p-type GaN contact layer (with a Mg concentration of $2 \times 10^{20}$ cm$^{-3}$) to 0.02 μm.

By setting the Mg concentration in the Mg-doped p-type GaN contact layer to a relatively high level on the order of $1 \times 10^{20}$ cm$^{-3}$, its ohmic contact with the p-side electrode is improved. However, in the case of semiconductor light emitting diodes, as opposed to semiconductor laser diodes, the distance between the above contact layer and the light emitting layer is small, causing concern about characteristics degradation due to Mg diffusion. Thus, by taking advantage of the large contact area between the p-side electrode and the above contact layer and the low current density during operation, the above Mg concentration can be reduced to the order of $1 \times 10^{19}$ cm$^{-3}$ without greatly compromising electrical characteristics to prevent Mg diffusion and improve light emission characteristics.

The first AlN buffer layer with high carbon concentration serves to alleviate its difference in crystal form from the substrate, and particularly reduces screw dislocations. The second AlN buffer layer with high purity has a flat surface at the atomic level. This reduces defects in the non-doped GaN buffer layer grown thereon. To this end, the thickness of the second AlN buffer layer with high purity is preferably larger than 1 μm. Furthermore, to avoid warpage due to strain, the thickness is preferably 4 μm or less. The second AlN buffer layer with high purity is not limited to AlN, but can be $Al_xGa_{1-x}N$ ($0.8 \leq x \leq 1$) to compensate for wafer warpage.

The non-doped GaN buffer layer serves to reduce defects by three-dimensional island growth on the second AlN buffer layer with high purity. The average thickness of the non-doped GaN buffer layer needs to be 2 μm or more to achieve a flat growth surface. From the viewpoint of reproducibility and warpage reduction, it is suitable that the total thickness of the non-doped GaN buffer layer is 4 to 10 μm.

Use of these buffer layers successfully reduces defects to approximately 1/10 of those in the conventional low-temperature grown AlN buffer layer. This technique enables high-concentration Si doping of an n-type GaN contact layer, and a semiconductor light emitting device with high efficiency can be fabricated even if it emits light in the ultraviolet band. Furthermore, reduction of crystal defects in the buffer layer also serves to prevent light absorption in the buffer layer. According to this embodiment, by providing the fourth film 71 in the n-side electrode 7, light emitted from the light emitting layer 3 can be reflected with high efficiency and extracted outside the device.

Next, formation of electrodes on the semiconductor layer is described.

FIGS. 2 and 3 are process cross-sectional views showing part of a process for manufacturing a semiconductor light emitting device shown in FIG. 1.

Figure 2A:
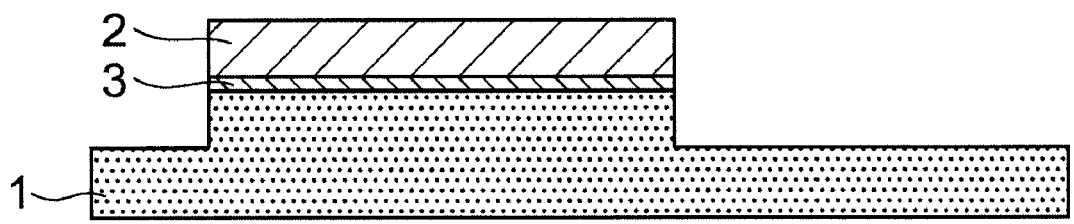
FIGS. 2A to 2C are process cross-sectional views showing part of a process for manufacturing the semiconductor light emitting device shown in FIG. 1.

First, as shown in FIG. 2A, the p-type semiconductor layer 2 and the light emitting layer 3 are removed by dry etching using a mask so that the n-type contact layer is exposed to the surface in a region of the p-type semiconductor layer 2. Subsequently, an $SiO_2$ film, not shown, is laminated 400 nm using a thermal CVD system throughout the semiconductor layer including the exposed n-type semiconductor layer 1.

Figure 2B:
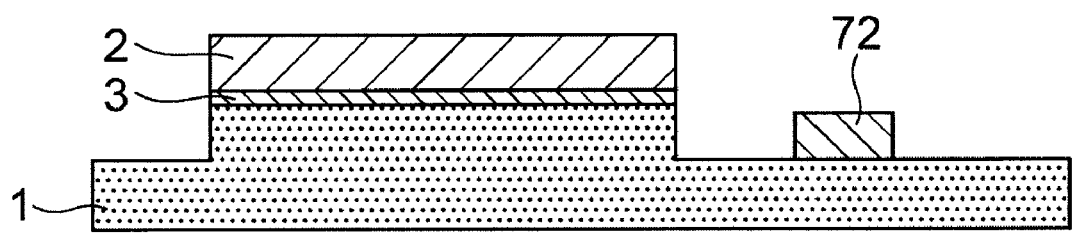

Next, as shown in FIG. 2B, a fifth metal film 72 serving as an n-side electrode region having ohmic characteristics is formed. A lift-off resist pattern is formed on the semiconductor layer, and part of the $SiO_2$ film on the exposed n-type contact layer is removed by ammonium fluoride treatment. In the region where the $SiO_2$ film is removed, a fifth metal film 72 illustratively made of Ti/Al/Ni/Au serving as an ohmic contact region is formed with a thickness of 500 nm using a vacuum evaporation system, and sintered in a nitrogen atmosphere at 550° C.

Figure 2C:
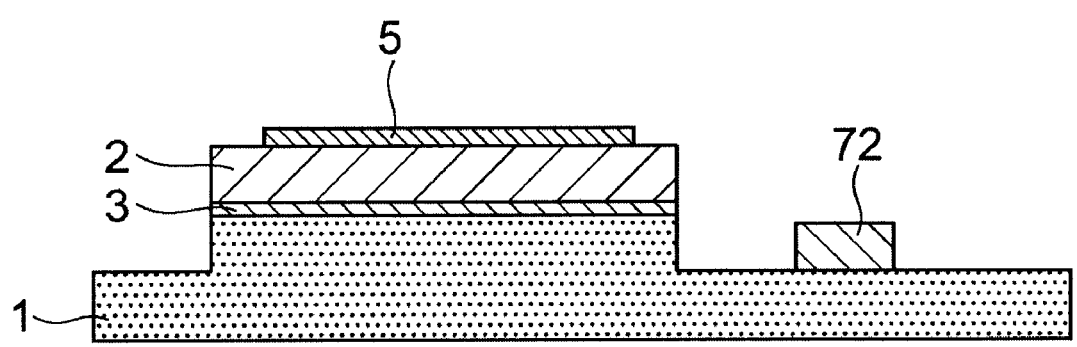

Next, as shown in FIG. 2C, to form a p-side electrode 4, a lift-off resist pattern is formed on the semiconductor layer, and part of the $SiO_2$ film on the p-type contact layer is removed by ammonium fluoride treatment. In the region where the $SiO_2$ film is removed, a first metal film 5 illustratively made of Ag is formed with a thickness of 200 nm using a vacuum evaporation system, and sintered in a nitrogen atmosphere at 350° C. after the lift-off.

Figure 3A:
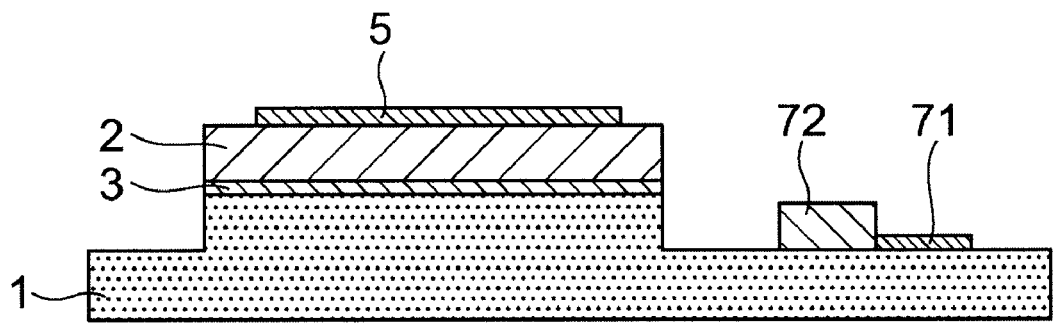
FIGS. 3A to 3C are process cross-sectional views showing part of a process for manufacturing the semiconductor light emitting device shown in FIG. 1.

Subsequently, as shown in FIG. 3A, an n-side electrode region having high-efficiency reflection characteristics is formed. A lift-off resist is formed with an opening on a region of the n-type contact layer located on the opposite side of the p-side electrode 4 across the fifth metal film 72, which is an n-side electrode region having ohmic characteristics. Here, in consideration of the alignment accuracy of the pattern, part of the top of the fifth metal film 72, which is an n-side electrode region having ohmic characteristics facing the p-side electrode 4, may be opened. Conversely, the two electrodes may be designed with a slight spacing therebetween in consideration of the alignment accuracy of the pattern to prevent the n-side electrode having high-efficiency reflection characteristics from climbing up the n-side electrode having ohmic characteristics. Furthermore, the n-side electrode having high-efficiency reflection characteristics may be designed to partly or entirely cover the top of the n-side electrode having ohmic characteristics.

A vacuum evaporation system is used to form, e.g., Al (with a thickness of approximately 0.2-0.5 μm)/Ni (with a thickness of approximately 10-50 nm)/Au (with a thickness of approximately 0.05-1 μm), followed by lift-off to form a fourth metal film 71 serving as a high-efficiency reflection film. Al serves as a high-efficiency reflection film. Au serves to protect the high-efficiency reflection film against degradation due to natural oxidation and chemical treatment during the device fabrication process. To improve adhesiveness and avoid alloying of Al and Au, Ni is sandwiched therebetween.

Figure 3B:
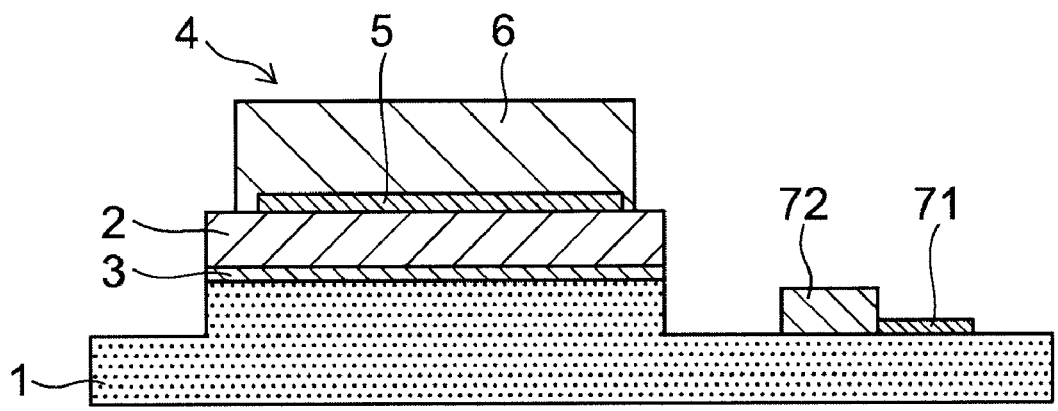

Furthermore, as shown in FIG. 3B, a lift-off resist pattern is formed on the semiconductor layer, and a second metal film 6 illustratively made of Pt/Au is formed with a thickness of 500 nm on the region provided with Ag to form a p-side electrode 4.

Figure 3C:
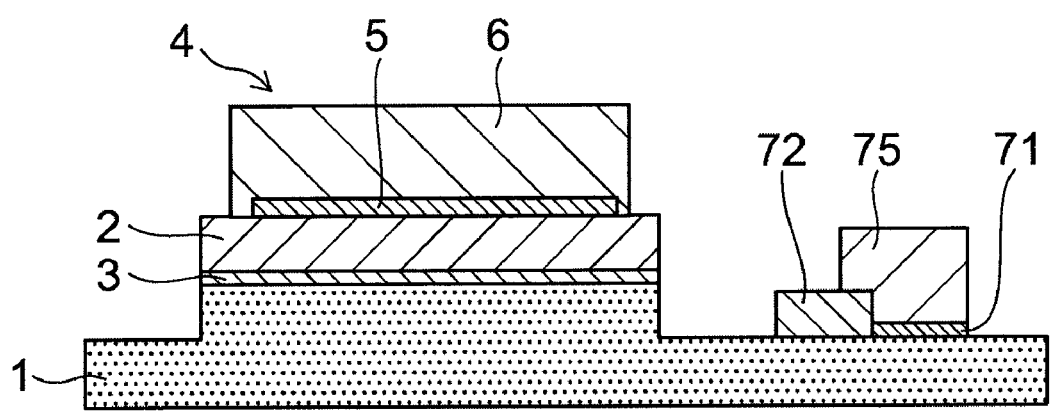

Finally, as shown in FIG. 3C, a lift-off resist pattern is formed likewise on the semiconductor layer, and a pad 75 illustratively made of Ti/Pt/Au is formed 500 nm to cover entirely the fourth metal film 71 of the n-side electrode 7 having high-efficiency reflection characteristics and part of the fifth metal film 72 of the n-side electrode 7 having ohmic characteristics.

Then, discrete LED devices are produced by cleavage or diamond blade cutting.

As the area of the fifth metal film 72 constituting the n-side electrode 7 and having ohmic characteristics becomes larger, the ohmic contact region increases, and hence the operating voltage tends to decrease. However, the current path during operation tends to concentrate on the n-side electrode facing the p-side electrode 4, that is, on the fifth metal film 72. Hence, the rate of decrease is saturated if the area of the fifth metal film 72 is increased to a certain extent. As the area of the fifth metal film 72 constituting the n-side electrode 7 and having ohmic characteristics becomes smaller, the fourth metal film 71 serving as an n-side electrode having high-efficiency reflection characteristics can be designed to have a larger area, and hence the light extraction efficiency is expected to increase. Furthermore, a larger area of the fourth metal film 71 having high-efficiency reflection characteristics results in increasing the probability that light reflected in the semiconductor light emitting device is externally extracted without absorption, and hence the light extraction efficiency is expected to increase. These can be taken into consideration to appropriately determine the area ratio and configuration of the fifth metal film 72 of the n-side electrode having ohmic characteristics and the fourth metal film 71 of the n-side electrode having high-efficiency reflection characteristics.

Figure 4:
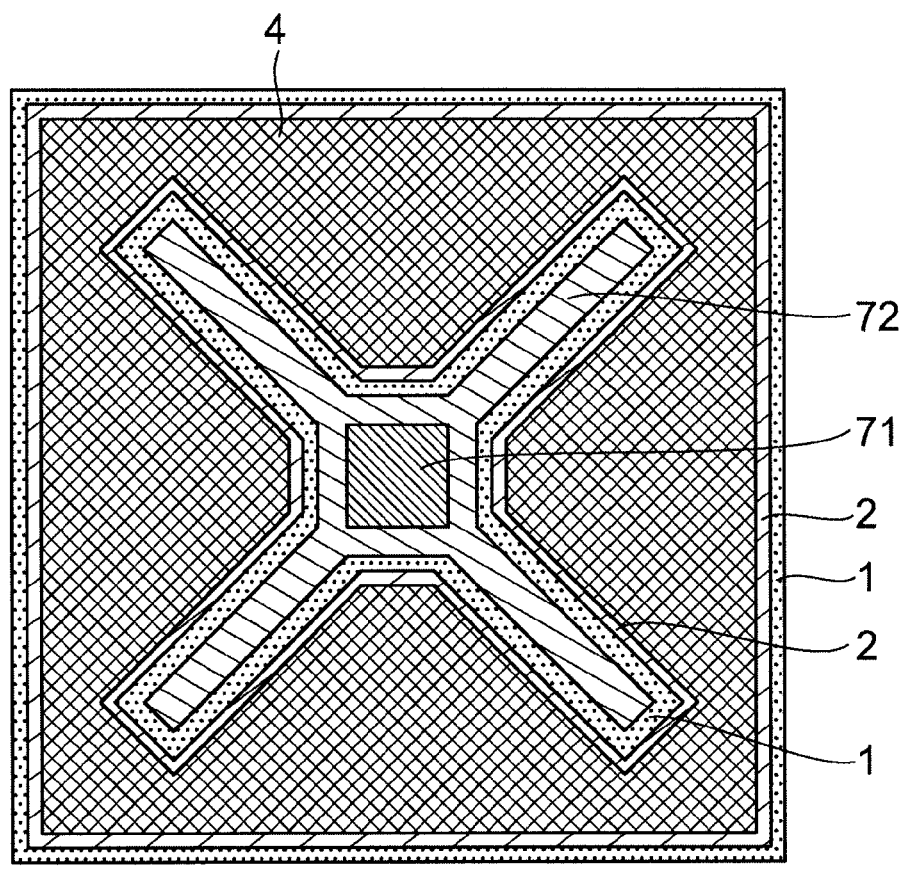
FIG. 4 is a schematic plan view showing other examples of the surface configuration of the semiconductor light emitting device of the embodiment.
Figure 5:
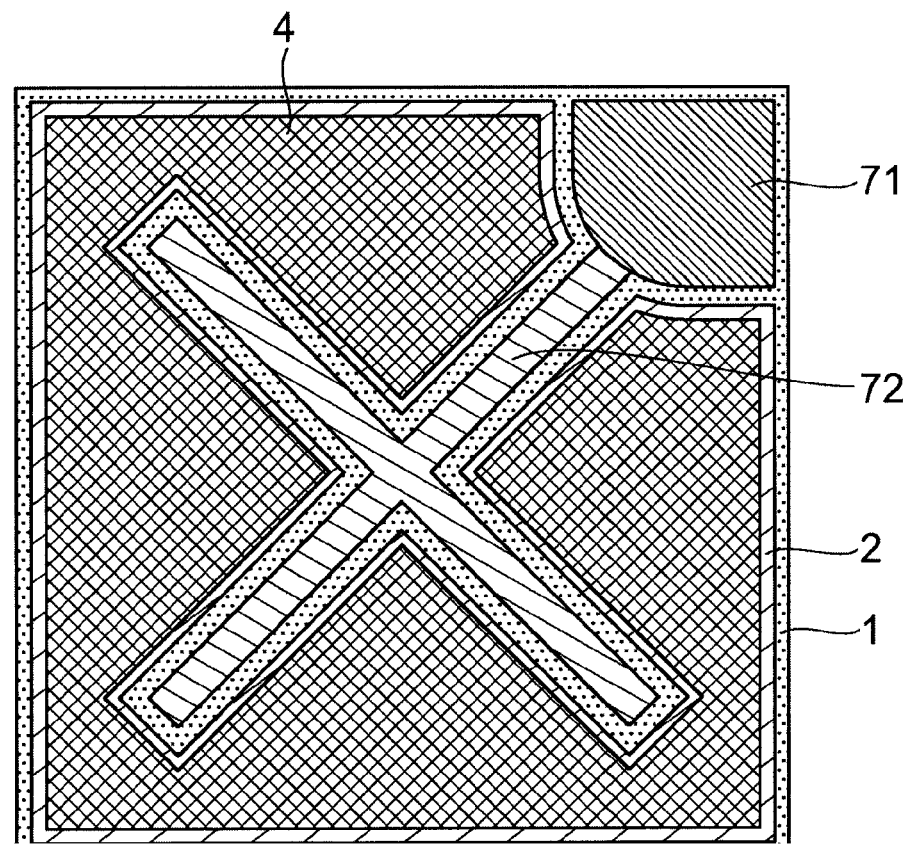
FIG. 5 is a schematic plan view showing other examples of the surface configuration of the semiconductor light emitting device of the embodiment.

FIGS. 4 and 5 are schematic plan views showing other examples of the surface configuration of the semiconductor light emitting device of this embodiment.

In the example shown in FIG. 4, the n-side electrode 7 is surrounded by the p-side electrode 4 and has four outwardly extending portions. In this n-side electrode 7, the four outwardly extending portions and the portion facing the p-side electrode 4 are formed from the fifth metal film 72 serving as an ohmic contact region. The central portion of the n-side electrode 7 is formed from the fourth metal film 71 having high reflectivity. Thus, ohmic contact is ensured in the portion facing the p-side electrode 4 to pass a current efficiently and uniformly throughout the device, whereas a region for wire bonding and bump formation is ensured in the central portion of the n-side electrode 7 where light can be reflected with high reflectivity.

In the example shown in FIG. 5, the region for wire bonding and bump formation in the n-side electrode 7 is provided at the corner of the device. The n-side electrode 7 has four outwardly extending portions which intrude into the p-side electrode 4. In this n-side electrode 7, the outwardly extending portions in the p-side electrode 4 are formed from the fifth metal film 72, and the corner portion for wire bonding and bump formation is formed from the fourth metal film 71. Thus, the current can be passed efficiently and uniformly throughout the device, whereas light emitted from the light emitting layer can be reflected at the fourth metal film with high reflectivity and extracted outside.

As shown in FIGS. 1, 4, and 5, in the n-side electrode region, the current injected from outside the semiconductor light emitting device into the p-side electrode 4 and flowing through the semiconductor layer to the n-side electrode 7 is extracted outside the semiconductor light emitting device. Thus, the n-side electrode region needs to be designed with a large area in relation to wire bonding and bump formation for contact between the semiconductor light emitting device and the external terminal. However, it is not necessary to provide ohmic characteristics throughout that region, but most of the region may be an n-side electrode having high-efficiency reflection characteristics. As in the example shown in FIG. 5, if any portion outside this region can be used to ensure an n-side electrode region having ohmic characteristics, the region for extraction to the outside of the semiconductor light emitting device can be entirely turned into a high-efficiency reflection film.

It is noted that the size of the pad required for bonding in the n-side electrode 7 is e.g. approximately 150 µm.

The semiconductor light emitting device according to this embodiment is made of at least an n-type semiconductor layer, a p-type semiconductor layer, and a semiconductor layer including a light emitting layer sandwiched therebetween. The material of the semiconductor layers is not particularly limited, but they are illustratively made of gallium nitride-based compound semiconductors such as $Al_xGa_{1-x-y}In_yN$ ($x \geqq 0$, $y \geqq 0$, $x+y \leqq 1$). The method for forming these semiconductor layers is not particularly limited, but it is possible to use conventionally known techniques such as metal organic chemical vapor deposition and molecular beam epitaxial growth.

The substrate material is not particularly limited, but it is possible to use common substrates made of sapphire, SiC, GaN, GaAs, or Si. The substrate may be finally removed.

The dielectric film can be made of oxides, nitrides, or oxynitrides of silicon (Si), aluminum (Al), zirconium (Zr), titanium (Ti), or niobium (Nb). Furthermore, the dielectric film can be composed of two or more layers. The total thickness of the laminated dielectric film is preferably 50 nm or more for ensuring insulation, and 1000 nm or less for preventing cracks in the dielectric film.

FIG. 6 is a schematic cross-sectional view illustrating the configuration of the p-side electrode 4 and the n-side electrode 7.

Figure 6A:
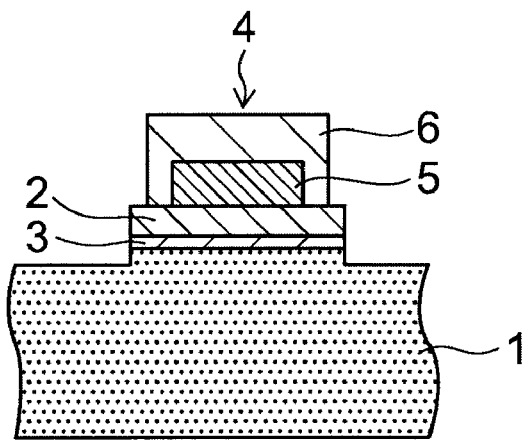
FIGS. 6A to 6D are schematic cross-sectional views illustrating the configuration of the p-side electrode 4 and the n-side electrode 7.
Figure 6B:
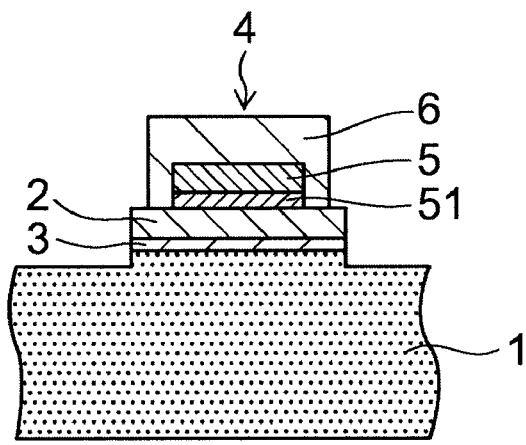
Figure 6C:
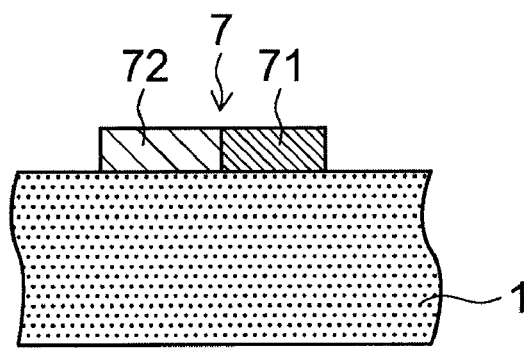

The p-side electrode may be composed of a first metal film 5 containing at least silver, aluminum, or an alloy of any of them and a second metal film 6 made of a metal not containing at least silver, aluminum, or an alloy of any of them (FIG. 6A), or may be composed of a first transparent electrode 51 containing at least one of nickel, indium tin oxide, and zinc oxide, a first metal film 5 containing at least silver, aluminum, or an alloy of any of them, and a second metal film 6 made of a metal not containing at least silver, aluminum, or an alloy of any of them (FIG. 6B). The first metal film 5 can be made of a single layer of silver or aluminum, or can be made of an alloy layer containing a metal other than silver and aluminum.

Typically, the reflection efficiency of a single-layer metal film for the visible band tends to decrease in the ultraviolet band of 400 nm or less as the wavelength becomes shorter. However, silver and aluminum have high reflection efficiency also for light in the ultraviolet band of 370 nm or more and 400 nm or less. Hence, in the case of a semiconductor light emitting device suitable for ultraviolet emission with the first metal film 5 made of a silver or aluminum alloy, it is preferable to increase the component ratio of silver or aluminum in the first metal film 5 on the semiconductor interface side. The thickness of the first metal film 5 is preferably 100 nm or more to ensure sufficient light reflection efficiency.

The first metal film 5 serves to efficiently reflect the light from the light emitting layer, and hence its area is preferably as large as possible. In the case where the first metal film 5 is made of silver or aluminum, as the distance between the first metal film 5 and the n-side electrode 7 increases, the risk of insulation failure and breakdown voltage failure due to migration of silver or aluminum decreases. On the other hand, as the distance between the first metal film 5 and the n-side electrode 7 decreases, the area of the first metal film 5 serving as a reflection film effectively increases, and the light extraction efficiency is improved. With regard to the current path from the first metal film 5 to the fifth metal film 72 of the n-side electrode, the current tends to concentrate on the region with the shortest distance between the first metal film 5 and the fifth metal film 72. Hence, to alleviate electric field concentration, the above region with the shortest distance preferably accounts for 50% or more and 100% or less of the region in which the first metal film 5 faces the fifth metal film 72. Furthermore, in plan view, as the length of the region in which the first metal film 5 faces the fifth metal film 72 increases, the number of current paths from the first metal film 5 to the fifth metal film 72 increases, which results in alleviating electric field concentration and preventing degradation of the first metal film 5. With these effects into consideration, it is possible to freely determine the area and configuration of the first metal film 5 and the distance between the first metal film 5 and the fifth metal film 72.

The first transparent electrode 51 contains at least one of nickel, indium tin oxide, and zinc oxide, and is in electrical contact with the p-type contact layer and the first metal film 5. The term "transparent electrode" used herein refers to an electrode made of a material having a bandgap that is larger than the transmitted emission wavelength, or an electrode made of a metal film having a thickness that is sufficiently smaller than the inverse of the absorption coefficient at the transmitted emission wavelength. To serve to transmit the light from the light emitting layer 3 and cause it to be reflected at the first metal film 5, it is preferable that the first transparent electrode 51 have substantially the same shape as the first metal film 5. The thickness of the first transparent electrode 51 is not particularly limited, but can be selected illustratively in the range of 1 to 500 nm.

The second metal film 6 is made of a metal not containing silver and aluminum, and is in electrical contact with the first metal film 5. The material of the second metal film 6 is not particularly limited, but it can be a single-layer or multilayer metal film, a metal alloy layer, a single-layer or multilayer conductive oxide film, or any combination thereof. The thickness of the second metal film 6 is not particularly limited, but can be selected illustratively in the range of 100 to 1000 nm. The second metal film 6 partly or entirely covers the first metal film 5. In particular, it is preferable that the first metal film 5 facing the n-side electrode 7 be entirely covered to prevent insulation failure and breakdown voltage failure due to migration of silver or aluminum.

Figure 6D:
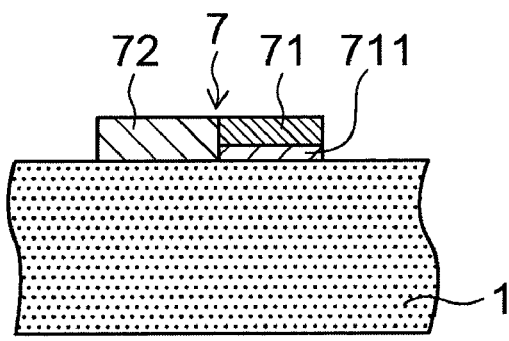

The n-side electrode 7 is composed of a region having high-efficiency reflection characteristics and a region having ohmic characteristics. The region having high-efficiency reflection characteristics may be composed of a fourth metal film 71 containing at least silver, aluminum, or an alloy of any of them (FIG. 6C), or may be composed of a second transparent electrode 711 containing at least one of nickel, indium tin oxide, and zinc oxide and a fourth metal film 71 containing at least silver, aluminum, or an alloy of any of them (FIG. 6D).

The fourth metal film 71 can be made of a single layer of silver or aluminum, or can be made of an alloy layer containing a metal other than silver and aluminum. Typically, the reflection efficiency of a single-layer metal film for the visible band tends to decrease as the wavelength becomes shorter. However, silver and aluminum have high reflection efficiency also for light in the ultraviolet band of 370 nm or more and 400 nm or less. Hence, in the case of a semiconductor light emitting device suitable for ultraviolet emission with the fourth metal film 71 made of a silver or aluminum alloy, it is preferable to increase the component ratio of silver or aluminum in the fourth metal film 71 on the semiconductor interface side. The thickness of the fourth metal film 71 is preferably 100 nm or more to ensure sufficient light reflection efficiency.

The second transparent electrode 711 contains at least one of nickel, indium tin oxide, and zinc oxide, and is in electrical contact with the n-type contact layer and the fourth metal film 71. To serve to transmit the light emitted from the light emitting layer 3 and reflected in the semiconductor light emitting device and cause it to be reflected at the fourth metal film 71, it is preferable that the second transparent electrode 711 have substantially the same shape as the fourth metal film 71. The thickness of the second transparent electrode 711 is not particularly limited, but can be selected illustratively in the range of 1 to 500 nm.

The material of the fifth metal film 72 formed in the region having ohmic characteristics is not particularly limited, but composed of a single-layer or multilayer conductive film used as an ohmic electrode of the n-type semiconductor. The thickness of the fifth metal film 72 is not particularly limited, but can be selected in the range of 5 to 1000 nm.

The fourth metal film serves to efficiently reflect the light emitted from the light emitting layer 3 and reflected in the semiconductor light emitting device, and hence its area is preferably as large as possible. During energization, the current relatively concentrates on the portion of the n-side electrode 7 facing the first metal film 5 of the p-side electrode 4. However, this portion is made of the fifth metal film having low contact resistance. This can minimize influence on electrical characteristics exerted by the high-efficiency reflection film formed in the n-side electrode 7, which does not necessarily have low contact resistance. In plan view, as the length of the region in which the first metal film 5 faces the fifth metal film 72 increases, the number of current paths from the first metal film 5 to the fifth metal film 72 increases, which results in alleviating electric field concentration and preventing degradation of the first metal film 5. With these effects into consideration, it is possible to freely determine the area and configuration of the fourth metal film 71 and the fifth metal film 72, and the area and configuration of the overall n-side electrode 7.

To block the fourth metal film 71 from ambient air, it is preferable that the pad of the n-side electrode 7 entirely cover the fourth metal film 71. Furthermore, the pad is at least partly in electrical contact with the fifth metal film 72. The thickness of the pad is not particularly limited, but can be selected illustratively in the range of 100 to 5000 nm. The pad 75 provides an electrode area required for bonding and bump formation, and can prevent natural oxidation of the fourth metal film 71 to improve device lifetime.

In the semiconductor light emitting device of this embodiment, part of the n-side electrode 7 is made of a high-efficiency reflection film. Thus, light repeating reflection inside the semiconductor light emitting device can be efficiently reflected also at part of the n-side electrode 7, and the light extraction efficiency can be improved. During energization, the current relatively concentrates on the portion of the n-side electrode 7 facing the p-side electrode 4. However, this portion is made of an electrode structure having low contact resistance. This can minimize influence on electrical characteristics exerted by the high-efficiency reflection film formed in the n-side electrode 7.

Furthermore, use of a crystal on a single-crystal AlN buffer enables high-concentration Si doping of an n-type GaN contact layer. This can significantly reduce its contact resistance with respect to the fifth metal film 72 serving as an ohmic contact region of the n-side electrode 7. Thus, current spreading in the fifth metal film 72 is prevented, and the current concentrates more intensively on a region near the p-side electrode. Hence, the n-side electrode 7 can be designed so that the area of its ohmic contact is decreased and the area of the high-efficiency reflection film is increased. Furthermore, reduction of crystal defects can provide a high emission efficiency even in the short-wavelength band below 400 nm, where the efficiency normally decreases.

In the case of using an amorphous or polycrystalline AlN layer to alleviate the difference in crystal form on the sapphire substrate, the buffer layer itself acts as a light absorber and decreases the light extraction efficiency of the light emitting device.

In contrast, according to this embodiment, the n-type first semiconductor layer 1, the light emitting layer 3, and the p-type second semiconductor layer 2 are formed on the sapphire substrate 10 via a single-crystal AlN buffer layer with high carbon concentration and a single-crystal AlN buffer layer with high purity. This configuration can prevent the buffer layers from acting as a light absorber and also significantly reduce crystal defects. Hence, absorbers in the crystal can be significantly decreased. In this case, the emitted light can repeat reflection many times in the crystal. This increases the lateral light extraction efficiency, and light can be efficiently reflected to the high-efficiency reflection region of the n-side electrode 7. These effects enable increased emission intensity, high throughput, and low cost.

Figure 7A:
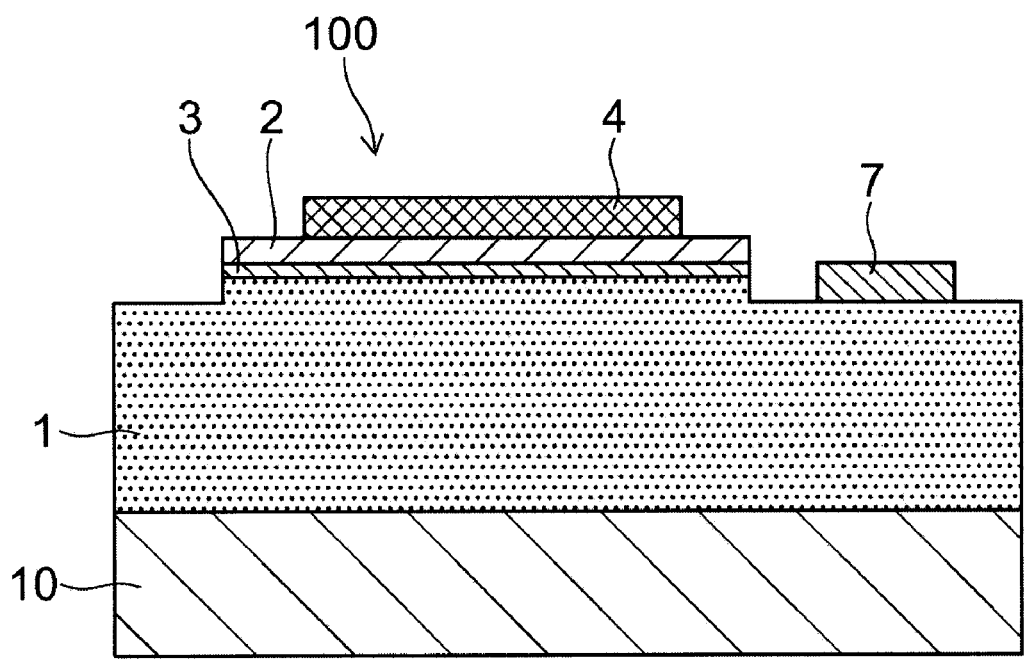
FIGS. 7A and 7B are a schematic cross-sectional view showing the structure of a semiconductor light emitting device according to a comparative example, and a schematic plan view thereof.
Figure 7B:
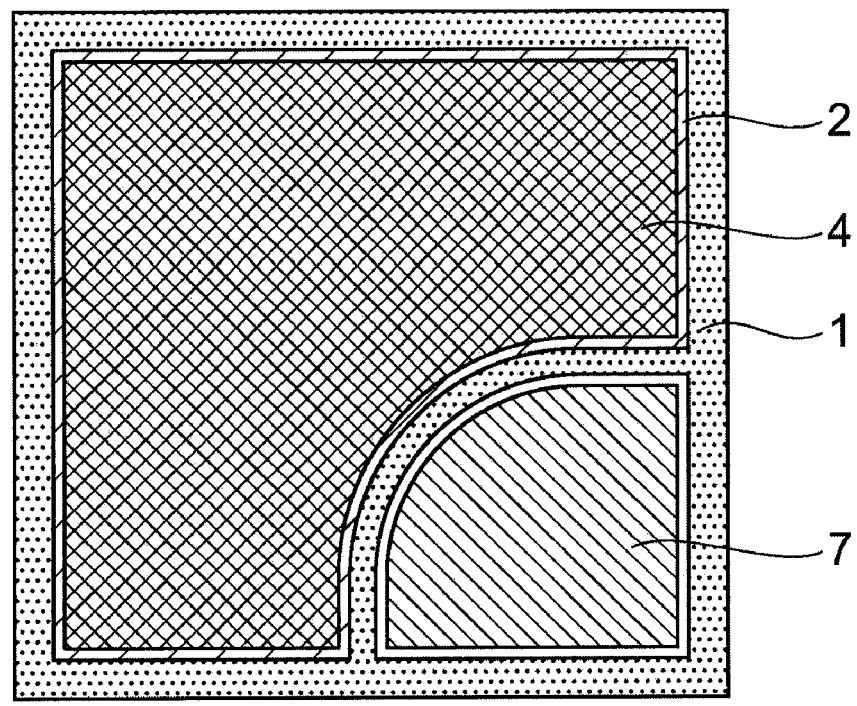

FIG. 7 is a schematic cross-sectional view showing the structure of a semiconductor light emitting device according to a comparative example.

The same components as those in FIG. 1 are labeled with like reference numerals, and the detailed description thereof is omitted. The n-side electrode 7 is made of a single metal layer. To form a p-side electrode 4, a lift-off resist pattern is formed on the semiconductor layer, and the $SiO_2$ film on the p-type contact layer is removed by ammonium fluoride treatment. In the region where the $SiO_2$ film is removed, a first metal film 5 made of Ag is formed with a thickness of 200 nm using a vacuum evaporation system, and sintered in a nitrogen atmosphere at 350° C. after the lift-off.

A lift-off resist pattern is formed likewise on the semiconductor layer, the $SiO_2$ film on the n-type contact layer is removed by ammonium fluoride treatment, and an n-side electrode 7 made of Ti/Pt/Au is formed with a thickness of 500 nm. Furthermore, a lift-off resist pattern is formed likewise on the semiconductor layer, and a second metal film 6 made of Pt/Au is formed with a thickness of 500 nm so as to cover the region in which the first metal film 5 made of Ag is formed.

In this comparative example, the entire surface of the n-side electrode 7 is formed from a metal for ohmic contact. However, in the case of using such a metal, the n-side electrode 7 does not necessarily have sufficiently high reflectivity. Furthermore, the ohmic contact region is prone to reaction (alloying) between the n-side electrode 7 and the n-type semiconductor layer 1, which also contributes to decreasing the light reflectivity. Hence, the comparative example has room for improvement in terms of light extraction efficiency for the light emitted from the light emitting layer 3.

In contrast, according to this embodiment, part of the n-side electrode is formed from a fourth metal film 71 with high reflectivity. Thus, the light extraction efficiency can be increased.

Figure 8:
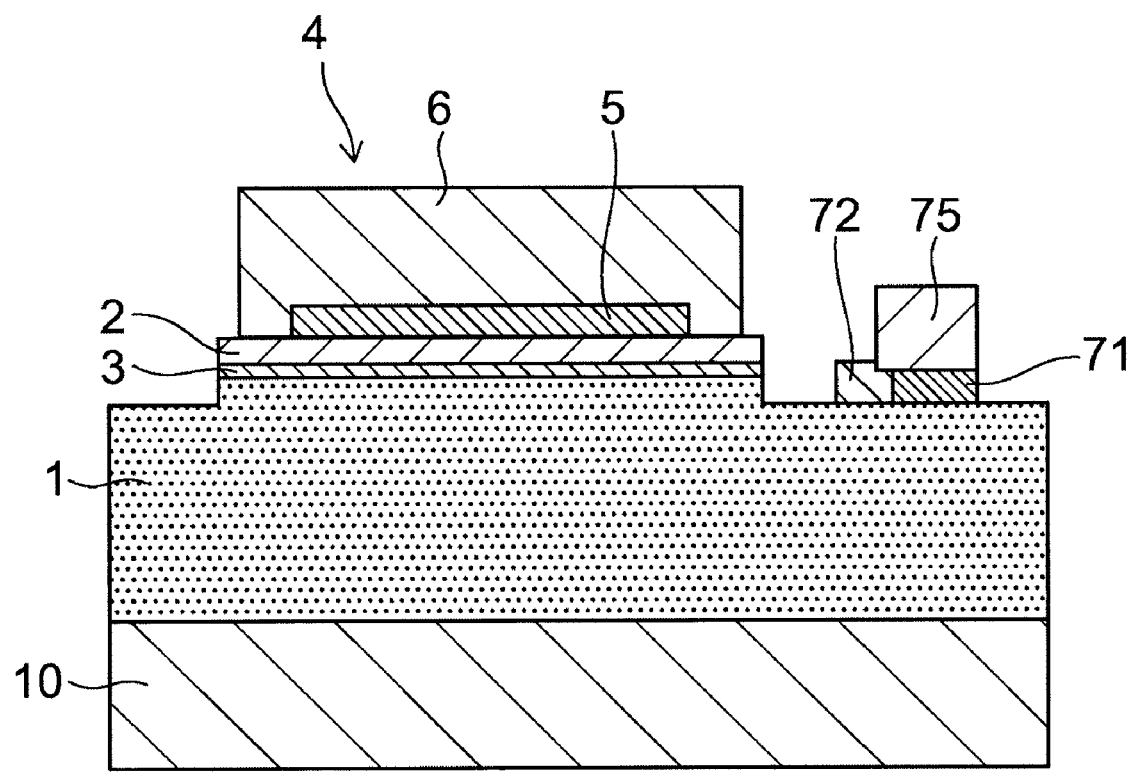
FIG. 8 is a schematic cross-sectional view showing the structure of a semiconductor light emitting device according to a second embodiment of the invention.

FIG. 8 is a schematic cross-sectional view showing the structure of a semiconductor light emitting device according to a second embodiment of the invention.

The same components as those in FIG. 1 are labeled with like reference numerals, and the detailed description thereof is omitted. In this embodiment, the p-side electrode 4 is formed simultaneously with the n-side electrode 7 having high-efficiency reflection characteristics. However, the structure of this embodiment is the same as FIG. 1.

FIGS. 9 and 10 are process cross-sectional views showing part of a process for manufacturing a semiconductor light emitting device shown in FIG. 8.

Figure 9A:
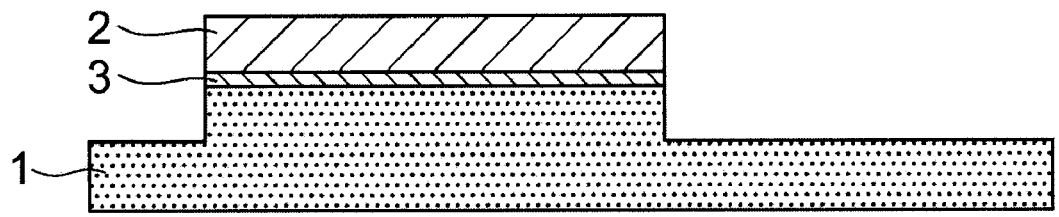
FIGS. 9A to 9C are process cross-sectional views showing part of a process for manufacturing the semiconductor light emitting device according to the second embodiment.

First, as shown in FIG. 9A, the p-type semiconductor layer 2 and the light emitting layer 3 are removed by dry etching using a mask so that the n-type contact layer is exposed to the surface in a region of the p-type semiconductor layer 2.

Figure 9B:
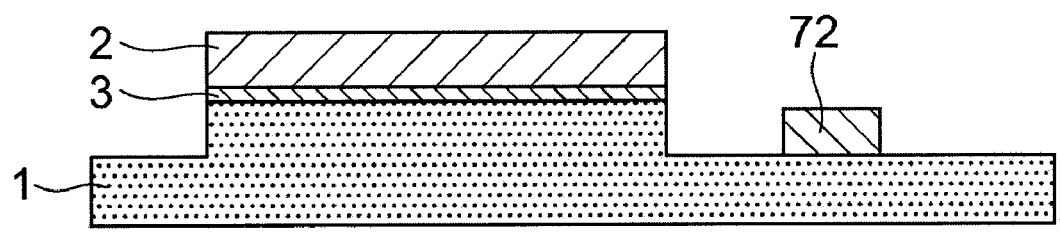

Next, as shown in FIG. 9B, a fifth metal film 72 serving as an n-side electrode region having ohmic characteristics is formed. A lift-off resist pattern is formed on the semiconductor layer, and part of the $SiO_2$ film on the n-type contact layer is removed by ammonium fluoride treatment. A fifth metal film 72 illustratively made of Ti/Al/Au is formed with a thickness of 500 nm, and sintered in a nitrogen atmosphere at 550° C.

Subsequently, the p-side electrode 4 is formed simultaneously with the n-side electrode region having high-efficiency reflection characteristics. A lift-off resist is formed with an opening on part of the p-type contact layer and a region of the n-type contact layer located on the opposite side of the p-type contact layer across the fifth metal film 72, which is an n-side electrode region having ohmic characteristics. Here, in consideration of the alignment accuracy of the pattern, part of the top of the n-side electrode having ohmic characteristics facing the p-type contact layer may be opened. Conversely, the two electrodes may be designed with a slight spacing therebetween in consideration of the alignment accuracy of the pattern to prevent the n-side electrode having high-efficiency reflection characteristics from climbing up the n-side electrode having ohmic characteristics. Furthermore, the n-side electrode having high-efficiency reflection characteristics may be designed to partly or entirely cover the top of the n-side electrode having ohmic characteristics.

Figure 9C:
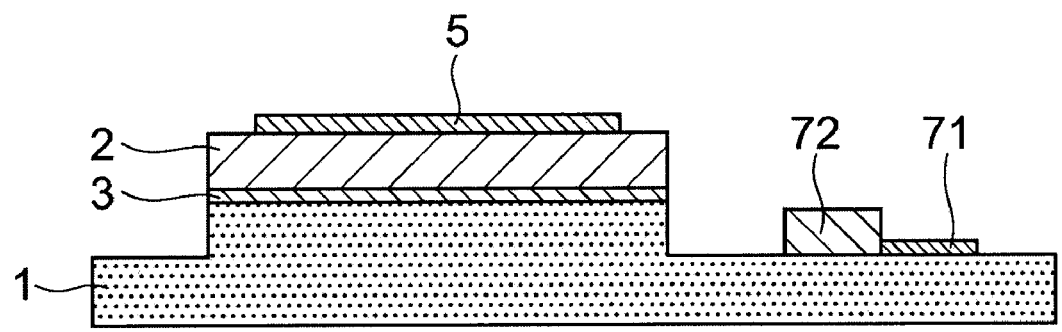

As shown in FIG. 9C, in the region where the $SiO_2$ film is removed, a first metal film 5 and a fourth metal film 71 illustratively made of Ag are simultaneously formed with a thickness of 200 nm using a vacuum evaporation system, and sintered in a nitrogen atmosphere at 350° C.

Figure 10A:
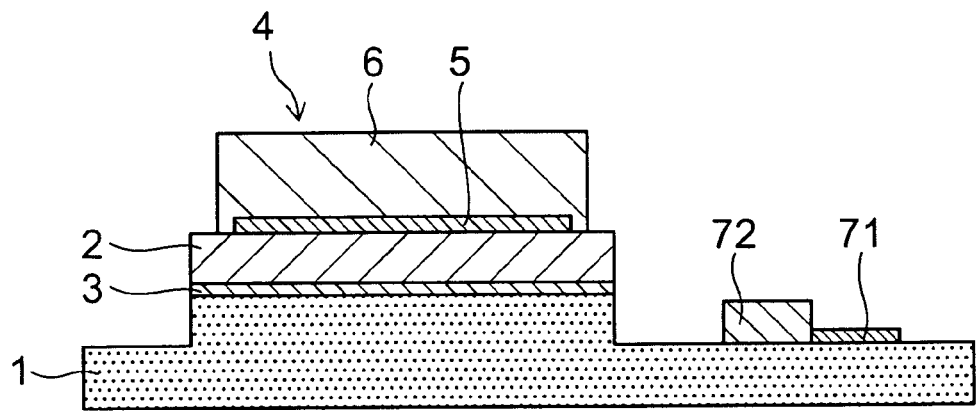
FIGS. 10A and 10B are process cross-sectional views showing part of a process for manufacturing the semiconductor light emitting device according to the second embodiment.

Furthermore, as shown in FIG. 10A, a lift-off resist pattern is formed likewise on the semiconductor layer, and a p-side electrode illustratively made of Pt/Au is formed with a thickness of 500 nm on the region provided with Ag of the first metal film.

Figure 10B:
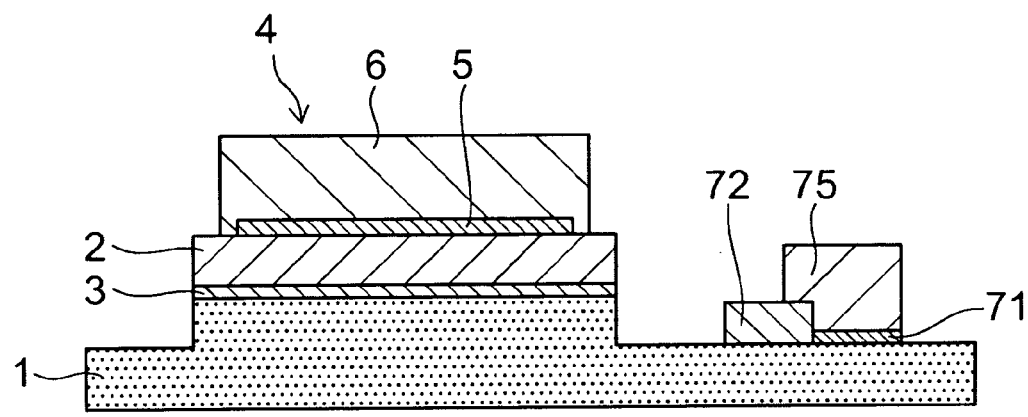

Finally, as shown in FIG. 10B, a lift-off resist pattern is formed likewise on the semiconductor layer, and a pad 75 illustratively made of Ti/Pt/Au is formed 500 nm to cover the fourth metal film 71 having high-efficiency reflection characteristics and part of the fifth metal film 72 having ohmic characteristics.

Simultaneous formation of the high-efficiency reflection films of the p-side electrode and the n-side electrode can reduce the number of processes, and realize high throughput and low cost.

Figure 11:
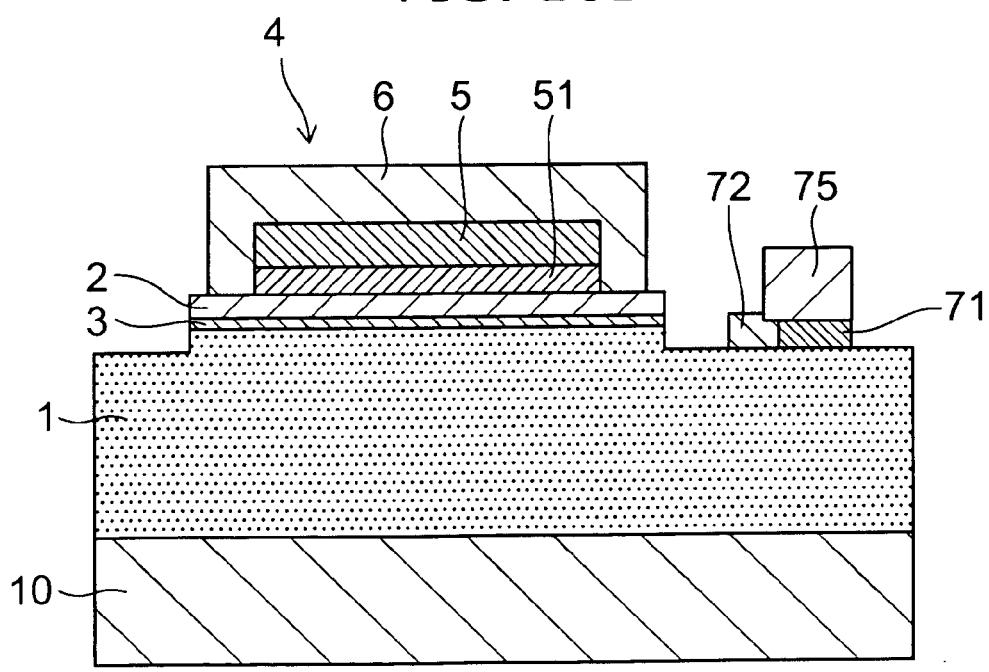
FIG. 11 is a schematic cross-sectional view showing the structure of a semiconductor light emitting device according to a third embodiment of the invention.

FIG. 11 is a schematic cross-sectional view showing the structure of a semiconductor light emitting device according to a third embodiment of the invention.

The same components as those in FIG. 1 are labeled with like reference numerals, and the detailed description thereof is omitted. In this embodiment, a transparent electrode 51 is formed in the p-side electrode 4, and the first metal film 5 is formed simultaneously with the fourth metal film 71 having high-efficiency reflection characteristics. In structure, this embodiment is different from FIG. 1 in that the transparent electrode 51 is added to the configuration of the p-side electrode 4.

FIGS. 12 and 13 are process cross-sectional views showing part of a process for manufacturing a semiconductor light emitting device shown in FIG. 11.

Figure 12A:
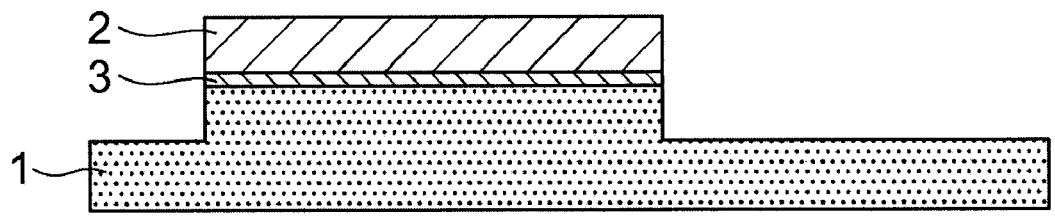
FIGS. 12A to 12C are process cross-sectional views showing part of a process for manufacturing the semiconductor light emitting device according to the third embodiment.

First, as shown in FIG. 12A, the p-type semiconductor layer 2 and the light emitting layer 3 are removed by dry etching using a mask so that the n-type contact layer is exposed to the surface in a region of the p-type semiconductor layer 2.

Figure 12B:
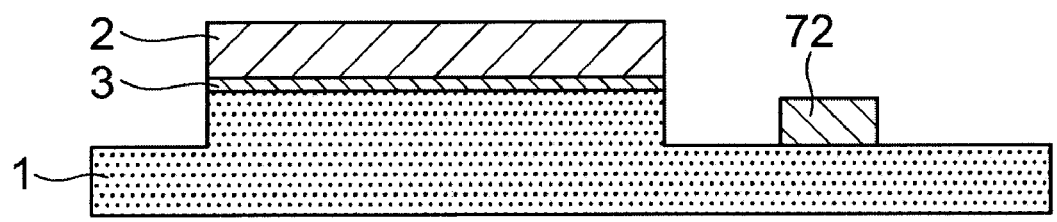

Next, as shown in FIG. 12B, a fifth metal film 72 serving as an n-side electrode region having ohmic characteristics is formed. A lift-off resist pattern is formed on the semiconductor layer, and part of the $SiO_2$ film on the n-type contact layer is removed by ammonium fluoride treatment. A fifth metal film 72 illustratively made of Ti/Al/Au is formed with a thickness of 500 nm, and sintered in a nitrogen atmosphere at 550° C.

Figure 12C:
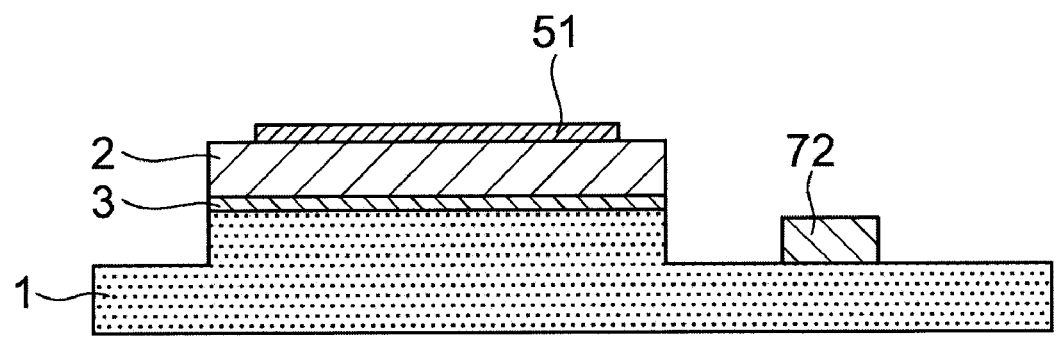

As shown in FIG. 12C, to form a transparent electrode 51 of the p-side electrode 4, a lift-off resist pattern is formed on the semiconductor layer, and part of the $SiO_2$ film on the p-type contact layer is removed by ammonium fluoride treatment. In the region where the $SiO_2$ film is removed, indium tin oxide (ITO) is illustratively formed with a thickness of 100 nm using a vacuum evaporation system.

Then, the p-side electrode 4 is formed simultaneously with the high-efficiency reflection region of the n-side electrode 7. A lift-off resist is formed with an opening on the top of the transparent electrode 51 and a region of the n-type contact layer located on the opposite side of the transparent electrode 51 on the p-type contact layer across the fifth metal film 72, which is an n-side electrode region having ohmic characteristics. Here, in consideration of the alignment accuracy of the pattern, part of the top of the n-side electrode having ohmic characteristics facing the p-type contact layer may be opened. Conversely, the two electrodes may be designed with a slight spacing therebetween in consideration of the alignment accuracy of the pattern to prevent the n-side electrode having high-efficiency reflection characteristics from climbing up the n-side electrode having ohmic characteristics. Furthermore, the n-side electrode having high-efficiency reflection characteristics may be designed to partly or entirely cover the top of the n-side electrode having ohmic characteristics.

Figure 13A:
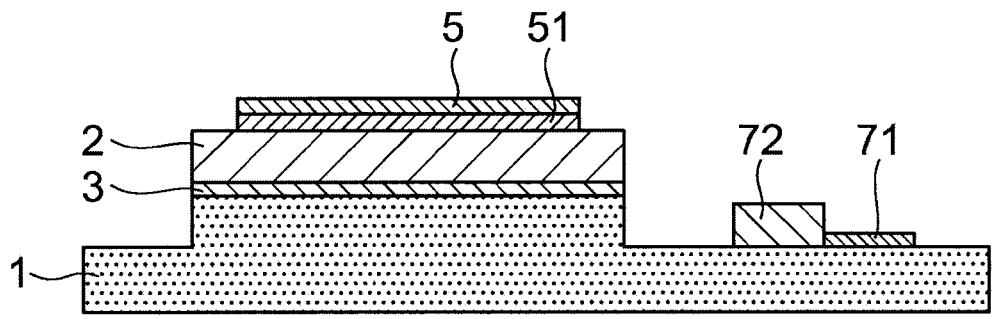
FIGS. 13A and 13B are process cross-sectional views showing part of a process for manufacturing the semiconductor light emitting device according to the third embodiment.

As shown in FIG. 13A, in the region where the $SiO_2$ film is removed by ammonium fluoride treatment, a first metal film 5 and a fourth metal film 71 illustratively made of Al/Ni/Au are formed with a thickness of 300 nm using a vacuum evaporation system.

Figure 13B:
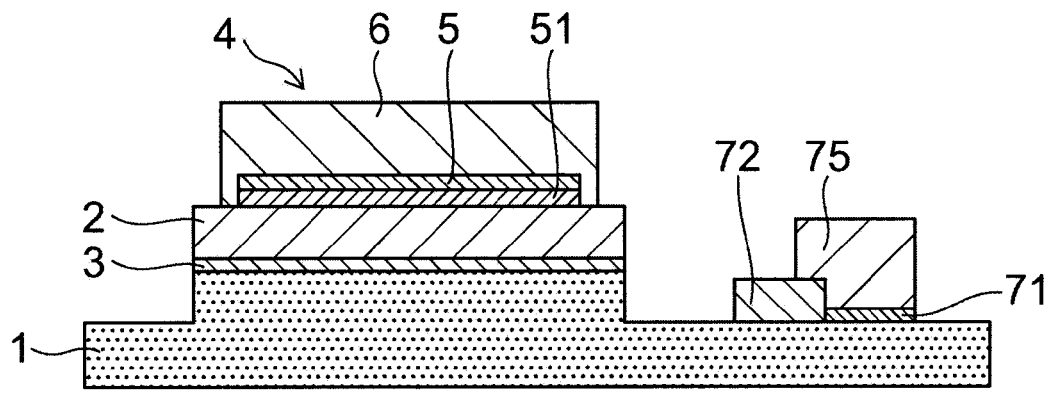

Finally, as shown in FIG. 13B, a lift-off resist pattern is formed likewise on the semiconductor layer, and a p-side electrode 4 and a pad 75 of the n-side electrode 7 illustratively made of Ti/Pt/Au are formed with a thickness of 500 nm to cover entirely the first metal film 5 and the high-efficiency reflection region of the n-side electrode 7 and part of the n-side electrode 7 having ohmic characteristics.

Simultaneous formation of the p-side electrode 4 and the high-efficiency reflection film of the n-side electrode 7, as well as the second metal film 6 of the p-side electrode 4 and the pad 75 of the n-side electrode 7, can reduce the number of processes, and realize high throughput and low cost.

Figure 14:
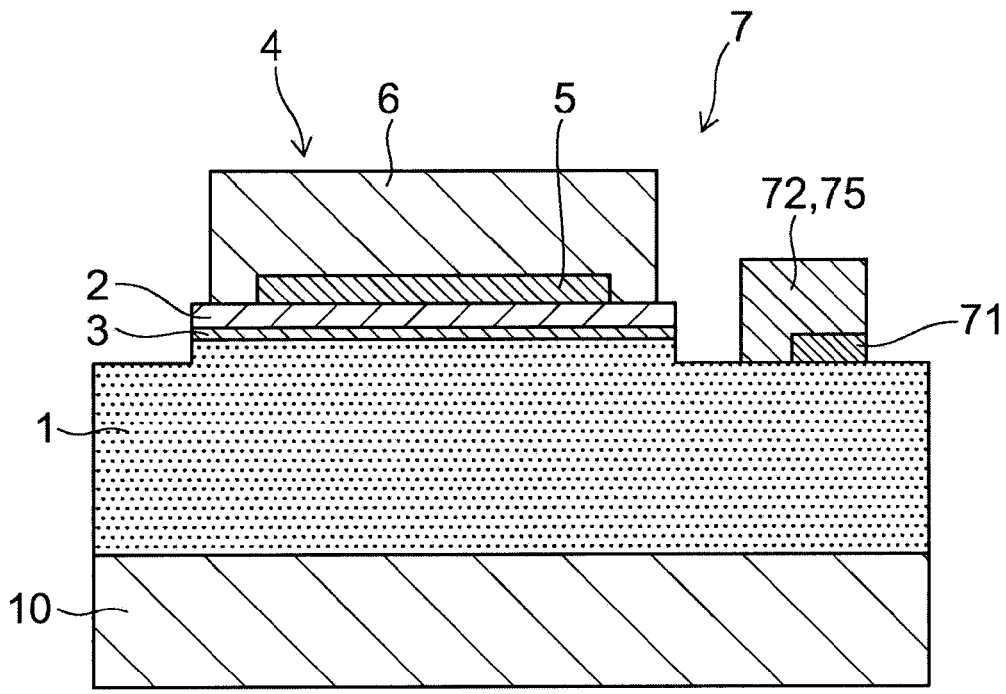
FIG. 14 is a schematic cross-sectional view showing the structure of a semiconductor light emitting device according to a fourth embodiment of the invention.

FIG. 14 is a schematic cross-sectional view showing the structure of a semiconductor light emitting device according to a fourth embodiment of the invention.

The same components as those in FIG. 1 are labeled with like reference numerals, and the detailed description thereof is omitted. In this embodiment, the p-side electrode 4 is simultaneously formed with the high-efficiency reflection film of the n-side electrode 7, and the second metal film 6 of the p-side electrode 4 is simultaneously formed with the fifth metal film and the pad 75 of the n-side electrode 7.

FIG. 15 is a process cross-sectional view showing part of a process for manufacturing a semiconductor light emitting device shown in FIG. 14.

Figure 15A:
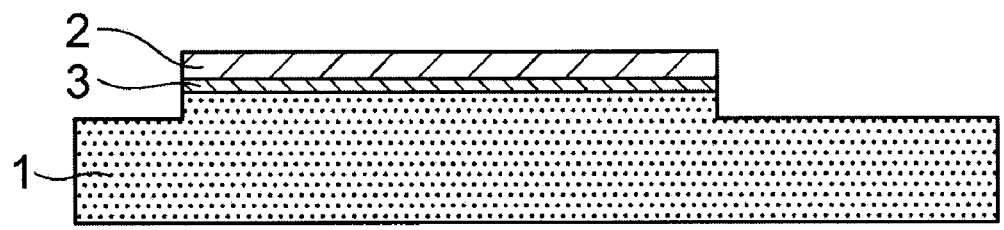
FIGS. 15A to 15C are process cross-sectional views showing part of a process for manufacturing the semiconductor light emitting device according to the fourth embodiment.

First, as shown in FIG. 15A, the p-type semiconductor layer 2 and the light emitting layer 3 are removed by dry etching using a mask so that the n-type contact layer is exposed to the surface in a region of the p-type semiconductor layer 2.

Figure 15B:
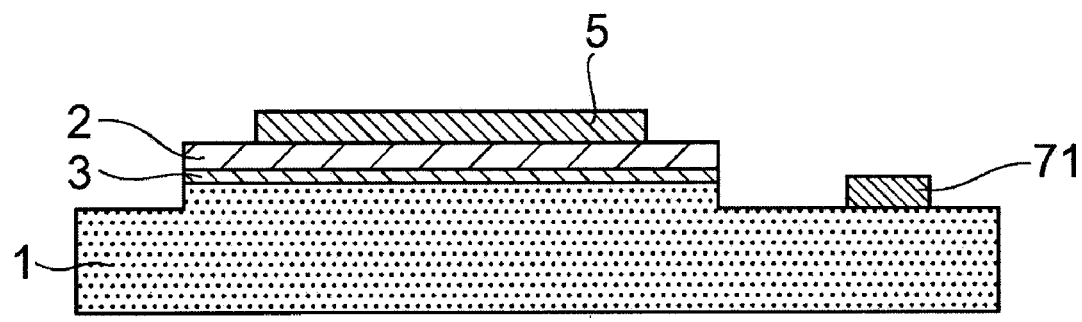

Next, as shown in FIG. 15B, to simultaneously form a p-side electrode 4 and the high-efficiency reflection region of the n-side electrode 7, a lift-off resist is formed with an opening on the n-type contact layer and part of the p-type contact layer. In the region where the $SiO_2$ film is removed by ammonium fluoride treatment, a first metal film 5 and a fourth metal film 71 illustratively made of Ag are simultaneously formed with a thickness of 200 nm using a vacuum evaporation system, and sintered in a nitrogen atmosphere at 350° C.

Figure 15C:
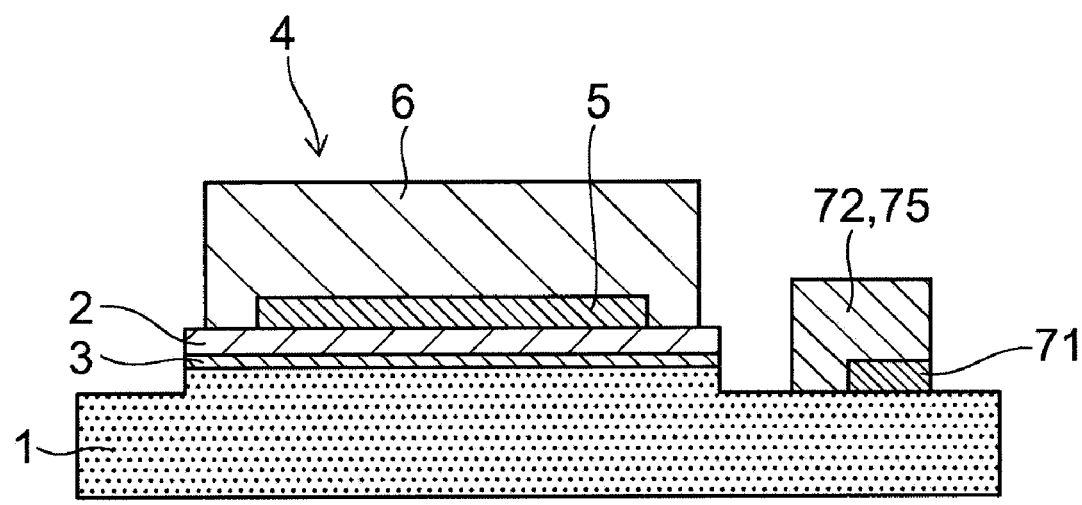

Furthermore, as shown in FIG. 15C, the second metal film 6 of the p-side electrode 4 is simultaneously formed with the fifth metal film 72 of the n-side electrode 7 doubling as the pad 75 of the n-side electrode 7 having ohmic characteristics. A lift-off resist is formed with an opening on the entirety of the fourth metal film 71, the first metal film 5, and a region of the n-type contact layer facing the p-type contact layer with respect to the fourth metal film 71, which is an n-side electrode region having high-efficiency reflection characteristics. In the region where the $SiO_2$ film is removed by ammonium fluoride treatment, a second metal film 6 and a fifth metal film 72 doubling as a pad 75, which are illustratively made of Ti/Pt/Au, are formed with a thickness of 500 nm using a vacuum evaporation system.

Simultaneous formation of the p-side electrode 4 and the high-efficiency reflection film of the n-side electrode 7, as well as the second metal film 6 of the p-side electrode 4 and the fifth metal film 72 doubling as the pad 75 of the n-side electrode 7, can reduce the number of processes, and realize high throughput and low cost.

Figure 16:
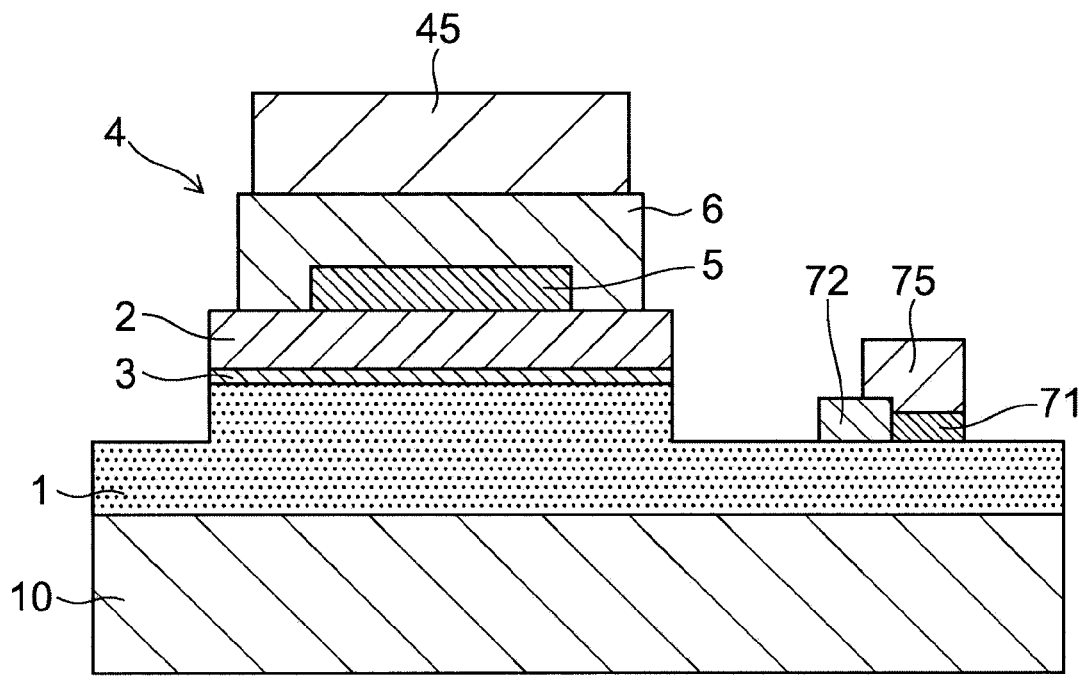
FIG. 16 is a schematic cross-sectional view showing the structure of a semiconductor light emitting device according to a fifth embodiment of the invention.

FIG. 16 is a schematic cross-sectional view showing the structure of a semiconductor light emitting device according to a fifth embodiment of the invention.

The same components as those in FIG. 1 are labeled with like reference numerals, and the detailed description thereof is omitted. In the semiconductor light emitting device 100 shown in FIG. 1, a pad 45 made of Au is formed with a thickness of 2000 nm to cover partly or entirely the region provided with Pt/Au. This enhances bondability, and improvement in heat dissipation of the semiconductor light emitting device can be also expected. This pad can also be used as a gold bump, or an AuSn bump can be formed instead of Au. The pad can be simultaneously formed on the n-side electrode 7.

In the case of separately providing a pad 45 on the p-side electrode 4 to enhance bondability for wire bonding, enhance die shear strength during gold bump formation by a ball bonder, and enable flip chip mounting, the thickness of the pad 45 is not particularly limited, but can be selected illustratively in the range of 100 to 5000 nm.

Figure 17:
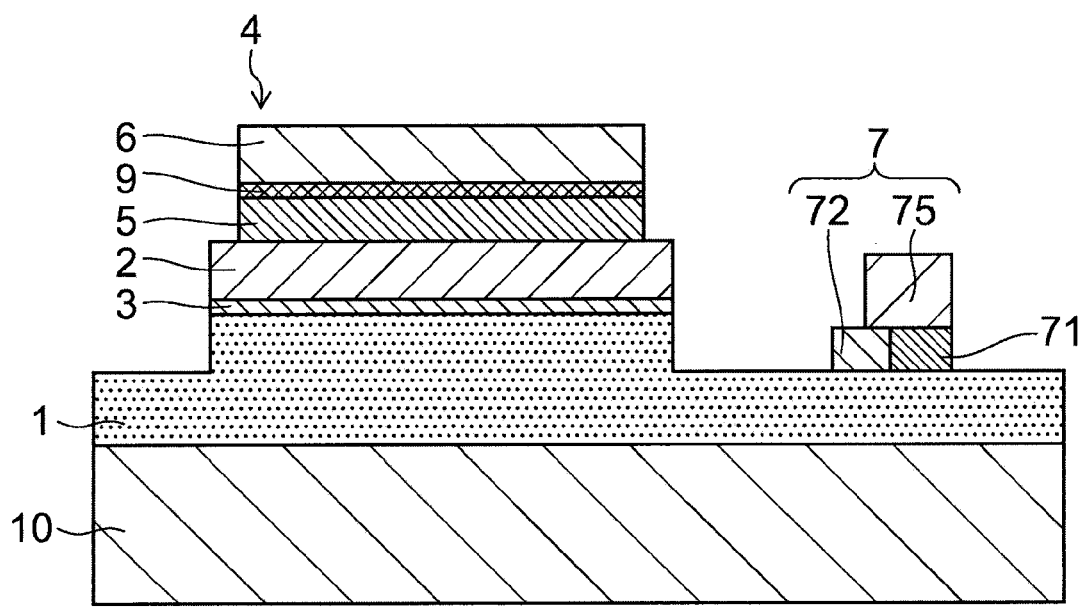
FIG. 17 is a schematic cross-sectional view showing the structure of a semiconductor light emitting device according to a sixth embodiment of the invention.

FIG. 17 is a schematic cross-sectional view showing the structure of a semiconductor light emitting device according to a sixth embodiment of the invention.

The same components as those in FIG. 1 are labeled with like reference numerals, and the detailed description thereof is omitted. This embodiment is different from FIG. 1 in that a third metal film 9 is added between the first metal film 5 and the second metal film 6.

A third metal film 9, which does not react with silver or not actively diffuse into silver and is in electrical contact with the first metal film 5 and the second metal film 6, can be provided between the first metal film 5 and the second metal film 6 in order to prevent the second metal film 6 from diffusing into or reacting with the first metal film 5. The third metal film 9 can be a single-layer or laminated film usable as a diffusion prevention layer made of a high melting point metal such as vanadium (V), chromium (Cr), iron (Fe), cobalt (Co), nickel (Ni), niobium (Nb), molybdenum (Mo), ruthenium (Ru), rhodium (Rh), tantalum (Ta), tungsten (W), rhenium (Re), osmium (Os), iridium (Ir), and platinum (Pt).

To ensure that no problem occurs due to some diffusion into the first metal film 5, it is more preferable to use a metal having a high work function and facilitating ohmic contact with the p-GaN contact layer, such as iron (Fe), cobalt (Co), nickel (Ni), rhodium (Rh), tungsten (W), rhenium (Re), osmium (Os), iridium (Ir), and platinum (Pt). In the case of a single-layer film, the thickness of the third metal film 9 is preferably in the range of 5 to 200 nm to maintain the film condition. In the case of a laminated film, the thickness is not particularly limited, but can be selected illustratively in the range of 10 to 10000 nm.

Figure 18:
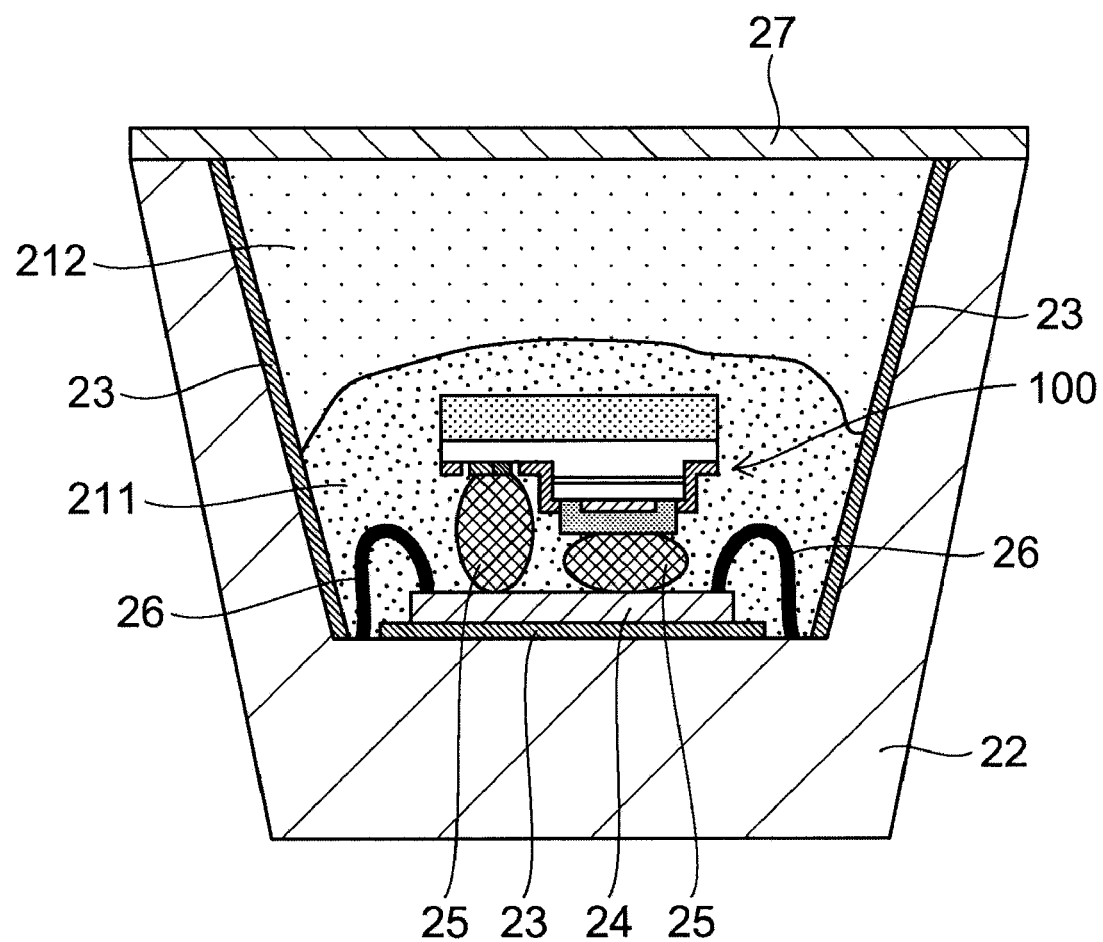
FIG. 18 is a schematic cross-sectional view showing the structure of a semiconductor light emitting apparatus based on the semiconductor light emitting device according to the embodiment.

FIG. 18 is a schematic cross-sectional view of a semiconductor light emitting apparatus based on the semiconductor light emitting device of an embodiment of the invention.

The semiconductor light emitting apparatus according to an embodiment of the invention is a white LED in which the semiconductor light emitting device 100 of the first embodiment in FIG. 1 is combined with phosphors.

More specifically, as shown in FIG. 18, a reflection film 23 is provided on the inner surface of a package 22 made of ceramic or the like, and the reflection film 23 is separately provided on the inner side surface and the bottom surface of the package 22. The reflection film 23 is illustratively made of aluminum. The semiconductor light emitting device 100 shown in FIG. 1 is placed via a submount 24 on the reflection film 23 provided at the bottom of the package 22. Gold bumps 25 are formed by a ball bonder on the semiconductor light emitting device 100 and fixed to the submount 24. Alternatively, the semiconductor light emitting device 100 can be directly fixed to the submount 24 without using gold bumps 25.

To fix the semiconductor light emitting device 100 of the first embodiment, the submount 24, and the reflection film 23, bonding with adhesive and soldering can be used. The surface of the submount 24 on the semiconductor light emitting device side is provided with electrodes which are patterned so that the p-side electrode 4 and the n-side electrode 7 of the semiconductor light emitting device 100 are insulated from each other. The electrodes of the submount 24 are connected through bonding wires 26 to electrodes, not shown, provided on the package 22. This connection is formed between the reflection film 23 on the inner side surface and the reflection film 23 on the bottom surface. Furthermore, a first phosphor layer 211 containing red phosphor is formed so as to cover the semiconductor light emitting device 100 and the bonding wires 26. On this phosphor layer is formed a second phosphor layer 212 containing blue, green, or yellow phosphor. A lid 27 made of a silicone resin is provided on this phosphor layer.

The first phosphor layer 211 contains a resin and a red phosphor dispersed in the resin. The red phosphor can be based on a matrix such as $Y_2O_3$, $YVO_4$, and $Y_2(P,V)O_4$, and contains therein trivalent Eu ($Eu^{3+}$) as an activator. That is, $Y_2O_3:Eu^{3+}$, $YVO_4:Eu^{3+}$ and the like can be used as a red phosphor. The concentration of $Eu^{3+}$ is 1% to 10% in terms of molarity. Besides $Y_2O_3$ and $YVO_4$, the matrix of the red phosphor can be LaOS or $Y_2(P,V)O_4$. Besides $Eu^{3+}$, it is also possible to use $Mn^{4+}$ and the like. In particular, addition of a small amount of Bi in combination with trivalent Eu to the $YVO_4$ matrix increases absorption at 380 nm, and hence the emission efficiency can be further increased. The resin can be a silicone resin and the like.

The second phosphor layer 212 contains a resin and a blue, green, or yellow phosphor dispersed in the resin. It is possible to use a combination of blue phosphor and green phosphor, a combination of blue phosphor and yellow phosphor, and a combination of blue phosphor, green phosphor, and yellow phosphor. The blue phosphor can be illustratively $(Sr,Ca)_{10}(PO_4)_6Cl_2:Eu^{2+}$ or $BaMg_2Al_{16}O_{27}:Eu^{2+}$. The green phosphor can be illustratively $Y_2SiO_5:Ce^{3+},Tb^{3+}$ with trivalent Tb acting as an emission center. Energy transfer from the Ce ion to the Tb ion enhances excitation efficiency. Alternatively, the green phosphor can be $Sr_4Al_{14}O_{25}:Eu^{2+}$. The yellow phosphor can be illustratively $Y_3Al_5:Ce^{3+}$. The resin can be a silicone resin and the like. In particular, trivalent Tb exhibits sharp emission around 550 nm where the visibility is maximized. Hence, its combination with the red emission of trivalent Eu significantly enhances emission efficiency.

In the semiconductor light emitting apparatus of this embodiment, the 380-nm ultraviolet light generated from the semiconductor light emitting device 100 according to the first embodiment is emitted toward the substrate of the semiconductor light emitting device 100. In combination with reflection at the reflection film 23, the above phosphors contained in the phosphor layers can be efficiently excited. For example, the above phosphor contained in the first phosphor layer 211 with trivalent Eu acting as an emission center converts the above light into light with a narrow wavelength distribution around 620 nm, and red visible light can be efficiently obtained. Furthermore, the blue, green, and yellow phosphor contained in the second phosphor layer 212 are efficiently excited, and blue, green, and yellow visible light can be efficiently obtained. As a color mixture of these, white light and light of various other colors can be efficiently obtained with good color rendition.

Next, a method for manufacturing a semiconductor light emitting apparatus according to this embodiment is described. The process for fabricating the semiconductor light emitting device 100 of FIG. 18 is illustratively the same as the process of the first embodiment.

First, a metal film to serve as a reflection film 23 is formed on the inner surface of the package 22 illustratively by sputtering, and this metal film is patterned to leave the reflection film 23 separately on the inner side surface and the bottom surface of the package 22. Next, gold bumps 25 are formed by a ball bonder on the semiconductor light emitting device 100 fabricated in the first embodiment, and the semiconductor light emitting device 100 is fixed onto a submount 24, which has electrodes patterned for the p-side electrode 4 and the n-side electrode 7. The submount 24 is placed on and fixed to the reflection film 23 on the bottom surface of the package 22. To fix them, bonding with adhesive and soldering can be used. Alternatively, the semiconductor light emitting device 100 can be directly fixed onto the submount 24 without using gold bumps 25 formed by a ball bonder.

Next, the n-side electrode and the p-side electrode, not shown, on the submount 24 are connected through bonding wires 26 to electrodes, not shown, provided on the package 22. Furthermore, a first phosphor layer 211 containing red phosphor is formed so as to cover the semiconductor light emitting device 100 fabricated in the first embodiment and the bonding wires 26. On the first phosphor layer 211 is formed a second phosphor layer 212 containing blue, green, or yellow phosphor. To form each phosphor layer, a raw resin liquid mixture dispersed with the phosphor is dropped, and then subjected to thermal polymerization by heat treatment to cure the resin. If the raw resin liquid mixture containing each phosphor is cured after it is dropped and left standing for a while, fine particles of the phosphor can be precipitated and biased toward the downside of the first and second phosphor layer 211, 212. Thus, the emission efficiency of each phosphor can be controlled as appropriate. Subsequently, a lid 27 is provided on the phosphor layer. Thus, a while LED according to this embodiment is fabricated.

The embodiments of the invention have been described with reference to the examples. However, the invention is not limited thereto. The shape, size, material, and placement of the elements constituting the semiconductor light emitting device such as the semiconductor multilayer film, metal film, and dielectric film, as well as the crystal growth process, can be variously modified by those skilled in the art without departing from the spirit of the invention, and any such modifications are encompassed within the scope of the invention. Furthermore, various embodiments of the invention can be made by suitable combinations of a plurality of components disclosed in the above examples. For instance, some components may be omitted from the entire components shown in the examples. Furthermore, components can be suitably combined with each other across different examples.

The "nitride semiconductor" referred to herein includes semiconductors having any composition represented by the chemical formula $B_xIn_yAl_zGa_{1-x-y-z}N$ ($0 \leq x \leq 1$, $0 \leq y \leq 1$, $0 \leq z \leq 1$, $x+y+z \leq 1$) where the composition ratios x, y, and z are varied in the respective ranges. Furthermore, the "nitride semiconductor" also includes those further containing any group V element other than N (nitrogen), and any of various dopants added for controlling conductivity types.

The invention claimed is:

1. A semiconductor light emitting device comprising:
a laminated body including a first semiconductor layer, a second semiconductor layer, and a light emitting layer provided between the first semiconductor layer and the second semiconductor layer;
a first electrode provided on a first major surface of the laminated body and connected to the first semiconductor layer; and
a second electrode provided on the first major surface of the laminated body and connected to the second semiconductor layer,
wherein the first electrode includes: a first region provided on the first semiconductor layer and including a first metal film that is in direct contact with the first semiconductor layer; and a second region provided on the first semiconductor layer and including a second metal film that is in direct contact with the first semiconductor layer, the second metal film having a higher reflectivity for light emitted from the light emitting layer than the first metal film and having a higher contact resistance with respect to the first semiconductor layer than the first metal film, and
wherein the second electrode includes: a third metal film that is in direct contact with the second semiconductor layer; and a fourth metal film that is in direct contact with the second semiconductor layer, the fourth metal film having a lower reflectivity for the light emitted from the light emitting layer than the third metal film.

2. The device according to claim 1, wherein the first region comprises a portion of the first electrode facing the second electrode.

3. The device according to claim 1, wherein the third metal film of the second electrode is made of the same metal as the second film.

4. The device according to claim 1, further comprising:
a first transparent conductive film provided between the first semiconductor layer and the second metal film.

5. The device according to claim 3, further comprising:
a second transparent conductive film provided between the second semiconductor layer and the third metal film.

6. The device according to claim 1, wherein the laminated body includes a substrate of sapphire on the side of a second major surface opposite to the first major surface.

7. The device according to claim 6, wherein the first semiconductor layer, the light emitting layer, and the second semiconductor layer are formed on the substrate via a single-crystal aluminum nitride layer.

8. The device according to claim 7, wherein the aluminum nitride layer includes a portion having a relatively high carbon concentration on the substrate side.

9. The device according to claim 1, further comprising:
a first pad covering entirely the second metal film and part of the first metal film.

10. The device according to claim 1, further comprising: a second pad covering at least part of the fourth metal film.

11. The device according to claim 1, further comprising: a fifth metal film provided between the third metal film and the fourth metal film.

* * * * *